United States Patent
Sugiura et al.

(10) Patent No.: US 10,847,704 B2
(45) Date of Patent: Nov. 24, 2020

(54) N-TYPE SEMICONDUCTOR LAYER, THERMOELECTRIC CONVERSION LAYER, THERMOELECTRIC CONVERSION ELEMENT, THERMOELECTRIC CONVERSION MODULE, AND COMPOSITION FOR FORMING N-TYPE SEMICONDUCTOR LAYER

(71) Applicant: FUJIFILM CORPORATION, Tokyo (JP)

(72) Inventors: Hiroki Sugiura, Ashigara-kami-gun (JP); Yoshinori Kanazawa, Ashigara-kami-gun (JP); Kimiatsu Nomura, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 52 days.

(21) Appl. No.: 16/243,196

(22) Filed: Jan. 9, 2019

(65) Prior Publication Data

US 2020/0028051 A1   Jan. 23, 2020

Related U.S. Application Data

(63) Continuation of application No. PCT/JP2017/024673, filed on Jul. 5, 2017.

(30) Foreign Application Priority Data

Jul. 11, 2016   (JP) .................. 2016-136910

(51) Int. Cl.
*H01L 35/24* (2006.01)
*H01L 35/28* (2006.01)
(Continued)

(52) U.S. Cl.
CPC ............ *H01L 35/24* (2013.01); *C01B 32/159* (2017.08); *C01B 32/174* (2017.08); *H01L 35/28* (2013.01);
(Continued)

(58) Field of Classification Search
CPC ...... H01L 35/24; H01L 35/28; H01L 51/0049; C01B 32/159; C01B 32/174
See application file for complete search history.

(56) References Cited

U.S. PATENT DOCUMENTS

2016/0104829 A1   4/2016  Hayashi et al.
2017/0110646 A1*  4/2017  Nonoguchi ............. H01L 35/34

FOREIGN PATENT DOCUMENTS

| JP | 2013-095820 A | 5/2013 |
| JP | 2015-012236 A | 1/2015 |
| JP | 2016-009851 A | 1/2016 |

OTHER PUBLICATIONS

Nonoguchi et al., "Simple Salt-Coordinated n-Type Nanocarbon Materials Stable in Air", Advanced Functional Materials, vol. 26 pp. 3021-3028 (Year: 2016).*

(Continued)

*Primary Examiner* — Jayne L Mershon
(74) *Attorney, Agent, or Firm* — Sughrue Mion, PLLC

(57) ABSTRACT

An object of the present invention is to provide a semiconductor layer (n-type semiconductor layer) which demonstrate an excellent thermoelectric conversion performance and exhibits n-type characteristics. Another object of the present invention is to provide a thermoelectric conversion layer formed of the n-type semiconductor layer and a composition for forming an n-type semiconductor layer. Still another object of the present invention is to provide a thermoelectric conversion element, which has the thermoelectric conversion layer as an n-type thermoelectric conversion layer, and a thermoelectric conversion module.
The n-type semiconductor layer of the embodiment of the present invention contains a nanocarbon material and an onium salt represented by a specific structure.

20 Claims, 5 Drawing Sheets

(51) Int. Cl.
    C01B 32/159     (2017.01)
    C01B 32/174     (2017.01)
    H01L 51/00      (2006.01)
(52) U.S. Cl.
    CPC ...... *H01L 51/0049* (2013.01); *C01B 2202/02* (2013.01)

(56) References Cited

OTHER PUBLICATIONS

Nonoguchi et al., "Simple Salt-Coordinated n-Type Nanocarbon Materials Stable in Air", Advanced Functional Materials, 2016, vol. 26. pp. 3021-3028 (total 8 pages).
Communication dated Jan. 7, 2020 from Japanese Patent Office in JP Application No. 2018-527541.
International Preliminary Report on Patentability with a Translation of Written Opinion issued from the International Bureau in counterpart International Application No. PCT/JP2017/024673, dated Jan. 15, 2019.
Written Opinion issued by the International Bureau in corresponding International Application No. PCT/JP2017/024673, dated Aug. 29, 2017.
International Search Report, issued by International Searching Authority in corresponding International Application No. PCT/JP2017/024673, dated Aug. 29, 2017.

* cited by examiner

N-TYPE SEMICONDUCTOR LAYER, THERMOELECTRIC CONVERSION LAYER, THERMOELECTRIC CONVERSION ELEMENT, THERMOELECTRIC CONVERSION MODULE, AND COMPOSITION FOR FORMING N-TYPE SEMICONDUCTOR LAYER

CROSS-REFERENCE TO RELATED APPLICATIONS

This application is a Continuation of PCT International Application No. PCT/JP2017/024673 filed on Jul. 5, 2017, which claims priority under 35 U.S.C. § 119(a) to Japanese Patent Application No. 2016-136910 filed on Jul. 11, 2016. The above application is hereby expressly incorporated by reference, in its entirety, into the present application.

BACKGROUND OF THE INVENTION

1. Field of the Invention

The present invention relates to an n-type semiconductor layer, a thermoelectric conversion layer, a thermoelectric conversion element, a thermoelectric conversion module, and a composition for forming an n-type semiconductor layer.

2. Description of the Related Art

Thermoelectric conversion materials that enable the interconversion of thermal energy and electric energy are used in power generating elements generating electric power from heat or thermoelectric conversion elements such as a Peltier element. Thermoelectric conversion elements can convert thermal energy directly into electric power, do not require a moving portion, and are used in, for example, wristwatches operating by body temperature, power supplies for backwoods, aerospace power supplies, and the like.

The conversion efficiency of a thermoelectric conversion material is represented by a dimensionless figure of merit ZT shown below. The dimensionless figure of merit ZT is represented by Formula (A). For improving the thermoelectric conversion performance, it is important to improve a Seebeck coefficient (a thermoelectromotive force per absolute temperature of 1 K) S and an electric conductivity $\sigma$ and to reduce a thermal conductivity $\kappa$.

$$\text{Dimensionless figure of merit } ZT = S^2 \cdot \sigma \cdot T/\kappa \quad \text{(A)}$$

In Formula (A), S (V/K) is a thermoelectromotive force (Seebeck coefficient) per absolute temperature of 1 K, $\sigma$ (S/m) is an electric conductivity, $\kappa$ (W/mK) is a thermal conductivity, and T (K) is an absolute temperature.

Thermoelectric conversion materials are roughly classified into two types including a p-type thermoelectric conversion material and an n-type thermoelectric conversion material. Among these, as the n-type thermoelectric conversion material, generally, inorganic materials such as bismuth telluride and nickel are known. However, the inorganic materials have problems in that the materials are expensive, contain harmful substances, and need to undergo a complicated working process so as to become a thermoelectric conversion element.

Therefore, in recent years, techniques using carbon materials represented by carbon nanotubes (hereinafter, referred to as "CNT" as well) have been suggested. For example, JP2016-009851A discloses a technique of preparing an n-type thermoelectric conversion material by reducing CNT by using an onium salt having a specific structure as a dopant.

SUMMARY OF THE INVENTION

Meanwhile, in recent years, in order to improve the performance of instruments using thermoelectric conversion elements, further improvement of the thermoelectric conversion performance of the thermoelectric conversion elements has been required.

In line with this trend, based on the description in JP2016-009851A, the inventors of the present invention prepared an n-type thermoelectric conversion layer by using a thermoelectric conversion material obtained by adding a tetrabutylammonium hydroxide salt (onium salt) to CNT. As a result, it was revealed that while the electric conductivity $\sigma$ was high, the Seebeck coefficient S was reduced. Furthermore, it was revealed that the thermal conductivity $\kappa$ increased in proportion to the high electric conductivity $\sigma$, and hence a figure of merit Z (represented by $Z = S^2 \cdot \sigma/\kappa$) (unit: 1/K)) was excessively reduced and becomes lower than that currently required.

The present invention has been made in consideration of the above circumstances, and an object thereof is to provide a semiconductor layer (n-type semiconductor layer) which demonstrates an excellent thermoelectric conversion performance and exhibits n-type characteristics.

Another object of the present invention is to provide a thermoelectric conversion layer formed of the n-type semiconductor layer and a composition for forming an n-type semiconductor layer.

Still another object of the present invention is to provide a thermoelectric conversion element, which has the thermoelectric conversion layer as an n-type thermoelectric conversion layer, and a thermoelectric conversion module.

In order to achieve the aforementioned objects, the inventors of the present invention conducted an intensive examination. As a result, the inventors have found that the aforementioned objects can be achieved by using an onium salt represented by Formula (1), which will be described later, as a dopant of a nanocarbon material, and accomplished the present invention.

That is, the inventors have found that the aforementioned objects can be achieved by the following constitution.

(1) An n-type semiconductor layer comprising a nanocarbon material and an onium salt represented by Formula (1) which will be described later.

(2) The n-type semiconductor layer described in (1), in which the $X^-$ is $Cl^-$, $Br^-$, or $I^-$.

(3) The n-type semiconductor layer described in (1) or (2), in which the $X^-$ is $Cl^-$ or $Br^-$.

(4) The n-type semiconductor layer described in any one of (1) to (3), in which a rate of weight loss of the nanocarbon material in the atmosphere at 600° C. is equal to or lower than 20%.

(5) The n-type semiconductor layer described in any one of (1) to (4), in which the nanocarbon material is carbon nanotubes.

(6) The n-type semiconductor layer described (5), in which the carbon nanotubes contain single-layer carbon nanotubes as a main component.

(7) The n-type semiconductor layer described in any one of (1) to (6) that has a film density equal to or higher than 0.45 gcm$^{-3}$.

(8) A thermoelectric conversion layer comprising the n-type semiconductor layer described in any one of (1) to (7).

(9) A thermoelectric conversion element comprising the thermoelectric conversion layer described in (8).

(10) A thermoelectric conversion module comprising a plurality of the thermoelectric conversion elements described in (9).

(11) A composition for forming an n-type semiconductor layer, comprising a nanocarbon material, and an onium salt represented by Formula (1) which will be described later.

(12) The composition for forming an n-type semiconductor layer described in (11), in which the $X^-$ is $F^-$, $Cl^-$, $Br^-$, or $I^-$.

(13) The composition for forming an n-type semiconductor layer described in (11) or (12), in which the $X^-$ is $Cl^-$ or $Br^-$.

(14) The composition for forming an n-type semiconductor layer described in any one of (11) to (13), in which a rate of weight loss of the nanocarbon material in the atmosphere at 600° C. is equal to or lower than 20%.

(15) The composition for forming an n-type semiconductor layer described in any one of (11) to (14), in which the nanocarbon material is carbon nanotubes.

(16) The composition for forming an n-type semiconductor layer described in (15), in which the carbon nanotubes contain single-layer carbon nanotubes as a main component.

According to the present invention, it is possible to provide a semiconductor layer (n-type semiconductor layer) which demonstrates an excellent thermoelectric conversion performance and exhibits n-type characteristics.

Furthermore, according to the present invention, it is possible to provide a thermoelectric conversion layer which is formed of the n-type semiconductor layer and a composition for forming an n-type semiconductor layer.

In addition, according to the present invention, it is possible to provide a thermoelectric conversion element, which has the thermoelectric conversion layer as an n-type thermoelectric conversion layer, and a thermoelectric conversion module.

DESCRIPTION OF THE PREFERRED EMBODIMENTS

Figure 1:
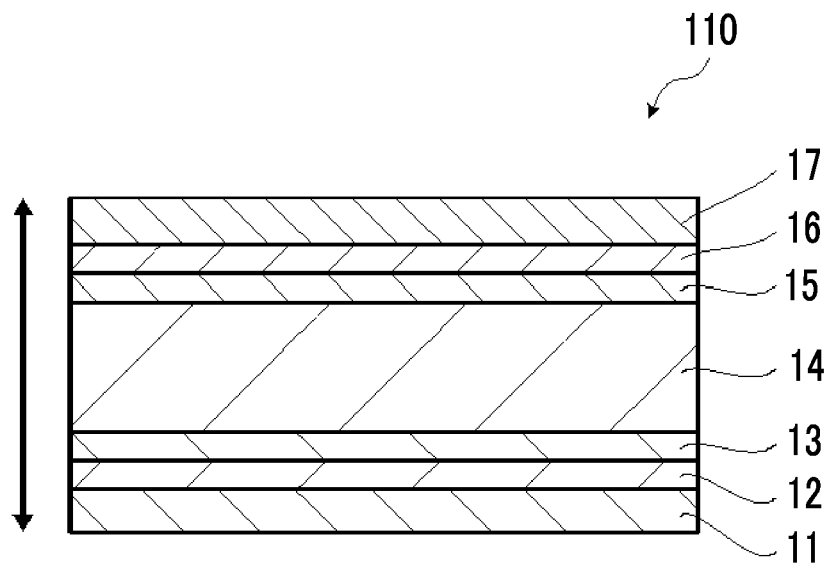
FIG. 1 is a cross-sectional view of a first embodiment of a thermoelectric conversion element of the present invention.

Hereinafter, an n-type semiconductor layer, a thermoelectric conversion layer, a thermoelectric conversion element, a thermoelectric conversion module, and a composition for forming an n-type semiconductor layer (particularly, a composition for forming a thermoelectric conversion layer) of the embodiment of the present invention will be described.

In the present specification, "(meth)acrylate" means either or both of acrylate and methacrylate, and includes a mixture of these.

Furthermore, in the present specification, a range of numerical values described using "to" means a range which includes the numerical values listed before and after "to" as a lower limit and an upper limit. The nanocarbon material, which is carbon nanotubes, is generally a mixture of semi-conductive CNT and metallic CNT and exhibits the properties of a semimetal. Accordingly, in the present invention, the ionization potential has the same definition as the Fermi level.

[n-Type Semiconductor Layer and Thermoelectric Conversion Layer]

Hereinafter, the n-type semiconductor layer of the embodiment of the present invention will be described.

The thermoelectric conversion layer of the embodiment of the present invention is formed of the n-type semiconductor layer of the embodiment of the present invention, and specifically means a thermoelectric conversion layer obtained by causing the n-type semiconductor layer of the embodiment of the present invention to function as a thermoelectric conversion layer.

Hereinafter, the n-type semiconductor layer of the embodiment of the present invention will be described by illustrating a thermoelectric conversion layer as an embodiment thereof for example. However, the function and the use of the n-type semiconductor layer of the embodiment of the present invention is not limited to this embodiment.

The n-type semiconductor layer of the embodiment of the present invention can be used in the thermoelectric conversion layer described below and, for example, in a diode or a transistor (for example, a field-effect transistor or the like).

First, a feature of the thermoelectric conversion layer of the embodiment of the present invention will be described.

The feature of the thermoelectric conversion layer of the embodiment of the present invention is that the thermoelectric conversion layer uses an n-type thermoelectric conversion material obtained by reducing a nanocarbon material represented by carbon nanotubes by using an onium salt represented by Formula (1), which will be described later, as a dopant.

In the thermoelectric conversion layer obtained by adopting the above constitution, excellently balanced electric conductivity σ and Seebeck coefficient S are achieved. Therefore, the thermoelectric conversion layer demonstrates an excellent thermoelectric conversion performance and exhibits n-type characteristics.

Presumably, because the onium salt represented by Formula (1) has the following characteristics, the effects of the present invention described above may be exhibited, although the details thereof are unclear.

It is known that in a thermoelectric conversion material, there is a trade-off relationship between a Seebeck coefficient S plus an electric conductivity σ and a carrier density. That is, in a case where the carrier density is improved, the electric conductivity σ is improved and the Seebeck coefficient S is reduced. Furthermore, the electric conductivity σ is proportional to the thermal conductivity κ. Accordingly, in a case where the electric conductivity σ is improved, the thermal conductivity κ is also improved, and hence the figure of merit Z is reduced. Therefore, from the viewpoint of improving the figure of merit Z, it is important to inhibit excessive doping and to control the Seebeck coefficient S and the thermal conductivity κ such that the Seebeck coefficient S becomes high and the thermal conductivity κ becomes low. An anionic portion in the onium salt represented by Formula (1) has weak properties as a dopant. That is, because the neucleophilicity of the anionic portion is weak, it is possible to inhibit excessive doping which may occur in a case where the dopant in JP2016-009851A is used. As a result, a high Seebeck coefficient S and a low thermal conductivity κ can be realized, and the figure of merit Z is improved. In a case where the nanocarbon material is CNT, and the onium salt represented by Formula (1) is used, the ionization potential (Fermi level) is found to slightly decrease (become shallow) before and after doping (amount of change of about 0.01 to 0.05 eV (preferably 0.01 to 0.03 eV)).

In contrast, in a case where the onium salt in JP2016-009851A exemplified in Comparative Example 1, which will be described later, is used, doping excessively proceeds, and the position of the ionization potential (Fermi level) greatly shifts. As a result, although the carrier density increases and the electric conductivity σ is improved, but the Seebeck coefficient S tends to be reduced.

That is, while the dopant of the related art causes excessive doping (great shift of the Fermi level), the onium salt represented by Formula (1) can inhibit the excessive doping (finely adjust the Fermi level).

A cationic portion in the onium salt represented by Formula (1) specifies the number of carbon atoms in $R^{11}$ to $R^{14}$ according to the neucleophilicity of the anionic portion. That is, in a case where the neucleophilicity of the anionic portion is weak, the nanocarbon material is easily doped to become a p-type by the cationic portion. Therefore, by imparting three-dimensional bulkiness to the onium salt by means of controlling the number of carbon atoms in $R^{11}$ to $R^{14}$ as described above, a structure is established which prevents the cationic portion from easily contacting the nanocarbon material. For example, in a case where the anionic portion represents a halogen ion such as $Cl^-$, $Br^-$, or $I^-$, at least any two or more groups among $R^{11}$ to $R^{14}$ each independently represent a monovalent organic group having 8 or more carbon atoms. It is considered that these structural characteristics may also contribute to the expression of excellent electric conductivity σ, Seebeck coefficient S, and figure of merit Z.

Furthermore, the inventors of the present invention have also confirmed that in a case where the onium salt represented by Formula (1) is used as a dopant, a variation in the figure of merit Z that results from the influence of moisture is reduced. For example, in a case where the onium salt in JP2016-009851A is used as a dopant, a variation in the figure of merit Z tends to be large. The detailed mechanism thereof is unclear, however, it is considered that in a case where the anion has strong nucleophilicity, doping may further proceed due to moisture. In contrast, because the anionic portion in the onium salt represented by Formula (1) has weak nucleophilicity, the onium salt is hardly influenced by moisture.

Hereinafter, each of the components contained in the thermoelectric conversion layer of the embodiment of the present invention will be described, and then a manufacturing method of a thermoelectric conversion layer of the embodiment of the present invention will be described.

[Onium Salt Represented by Formula (1)]

Hereinafter, the onium salt represented by Formula (1) will be described.

(1)

In Formula (1), $R^{11}$, $R^{12}$, $R^{13}$, and $R^{14}$ each independently represent a monovalent organic group selected from the group consisting of an aliphatic hydrocarbon group, an aralkyl group, an aryl group, and a heterocyclic group. The aliphatic hydrocarbon group may be any of a linear, branched, or cyclic aliphatic hydrocarbon group and may contain a heteroatom.

$X^-$ represents $F^-$, $Cl^-$, $Br^-$, $I^-$, $P(=O)(OH)_2O^-$, or $NO_3^-$.

Here, in a case where $X^-$ represents $Cl^-$, $Br^-$, $I^-$, or $NO_3^-$, at least any two or more groups among $R^{11}$ to $R^{14}$ each independently represent a monovalent organic group having 8 or more carbon atoms. In a case where $X^-$ represents $P(=O)(OH)_2O^-$, at least any two or more groups among $R^{11}$ to $R^{14}$ each independently represent a monovalent organic group having 6 or more carbon atoms. In a case where $X^-$ represents $F^-$, at least any two or more groups among $R^{11}$ to $R^{14}$ each independently represent a monovalent organic group having 1 or more carbon atoms.

In Formula (1), $R^{11}$, $R^{12}$, $R^{13}$, and $R^{14}$ each independently represent a monovalent organic group selected from the group consisting of an aliphatic hydrocarbon group, an aralkyl group, an aryl group, and a heterocyclic group.

Examples of the aliphatic hydrocarbon group in Formula (1) include an alkyl group (preferably having 1 to 40 carbon atoms, more preferably having 1 to 30 carbon atoms, and even more preferably having 1 to 20 carbon atoms), an alkenyl group (preferably having 2 to 40 carbon atoms, more preferably having 2 to 30 carbon atoms, and even more preferably having 2 to 20 carbon atoms), an alkynyl group (preferably having 2 to 40 carbon atoms, more preferably having 2 to 30 carbon atoms, and even more preferably having 2 to 20 carbon atoms), and the like. Among these, an alkyl group is preferable.

The aliphatic hydrocarbon group may be any of a linear, branched, or cyclic aliphatic hydrocarbon group, and is preferably a linear aliphatic hydrocarbon group.

As the aralkyl group in Formula (1), for example, an aralkyl group having 7 to 20 carbon atoms is preferable. Specifically, examples thereof include a benzyl group, a phenethyl group, a 1-naphthylmethyl group, a 1-(1-naphthyl)ethyl group, a triphenylmethyl group, and the like.

The aliphatic hydrocarbon group may contain a heteroatom. The type of the heteroatom is not particularly limited, and examples thereof include an oxygen atom, a nitrogen atom, a sulfur atom, a selenium atom, a tellurium atom, and the like. From the viewpoint of making the onium salt represented by Formula (1) function better as a dopant for change to an n-type, it is preferable that the heteroatom is incorporated in the form of —Y₁—, —N(Ra)—, —C(=Y₂)—, —CON(Rb)—, —C(=Y₃)Y₄—, —SOt-, —SO₂N(Rc)-, or a group obtained by combining these, among the above.

Y₁ to Y₄ is each independently selected from the group consisting of an oxygen atom, a sulfur atom, a selenium atom, and a tellurium atom. Among these, an oxygen atom or a sulfur atom is preferable because these can be handled more simply. t represents an integer of 1 to 3. Ra, Rb, and Rc each independently represent a hydrogen atom or an alkyl group having 1 to 10 carbon atoms.

As the heterocyclic group in Formula (1), for example, a heterocyclic ring having 3 to 12 carbon atoms is preferable. Examples thereof include a furyl group, a thiofuryl group, a pyridyl group, a pyrazole group, an imidazolyl group, a benzimidazolyl group, an indolyl group, a quinolyl group, an isoquinolyl group, a purine group, a pyrimidyl group, a pirazyl group, an oxazolyl group, a thiazolyl group, a triazyl group, a carbazolyl group, a quinoxalyl group, a thiazine group, and the like.

In Formula (1), R¹¹, R¹², R¹³, and R¹⁴ may further have a substituent. Examples of the substituent include a halogen atom (for example, a fluorine atom, a chlorine atom, a bromine atom, or an iodine atom).

R¹¹, R¹², R¹³, and R¹⁴ in Formula (1) preferably each represent an aliphatic hydrocarbon group.

In Formula (1), X⁻ represents F⁻, Cl⁻, Br⁻, I⁻, P(=O)(OH)₂O⁻, or NO₃⁻. Among these, from the viewpoint of doping control, Cl⁻, Br⁻, or I⁻ is preferable, and Cl⁻ or Br⁻ is more preferable.

In a case where X⁻ in Formula (1) represents Cl⁻, Br⁻, I⁻, or NO₃⁻, at least any two or more groups among R¹¹ to R¹⁴ each independently represent a monovalent organic group having 8 or more carbon atoms.

From the viewpoint of the availability of compounds and raw materials and the cost, it is desirable that the number of carbon atoms is equal to or smaller than 40. The number of carbon atoms is preferably 8 to 30, and more preferably 8 to 20. From the viewpoint of doping the nanocarbon material to become an n-type by the anion, it is preferable that at least any three or more groups among R¹¹ to R¹⁴ represent a monovalent organic groups having 8 or more carbon atoms, and it is more preferable that all of R¹¹ to R¹⁴ represent a monovalent organic group having 8 or more carbon atoms.

In a case where X⁻ represents P(=O)(OH)₂O⁻, at least any two or more groups among R¹¹ to R¹⁴ each independently represent a monovalent organic group having 6 or more carbon atoms. From the viewpoint of the availability of raw materials and the cost, it is desirable that the number of carbon atoms is equal to or smaller than 40. The number of carbon atoms is preferably 6 to 30, and more preferably 6 to 20. From the viewpoint of doping the nanocarbon material to become an n-type by the anion, it is preferable that at least any three or more groups among R¹¹ to R¹⁴ represent a monovalent organic group having 6 or more carbon atoms, and it is more preferable that all of R¹¹ to R¹⁴ represent a monovalent organic group having 6 or more carbon atoms.

In a case where X⁻ represents F⁻, at least any two or more groups among R¹¹ to R¹⁴ each independently represent a monovalent organic group having 1 or more carbon atoms. From the viewpoint of the availability of compounds or raw materials and the cost, it is desirable that the number of carbon atoms is equal to or smaller than 30. The number of carbon atoms is preferably 1 to 20, and more preferably 1 to 10. From the viewpoint of doping the nanocarbon material to become an n-type by the anion, it is preferable that at least any three or more groups among R¹¹ to R¹⁴ represent a monovalent organic group having 1 or more carbon atoms, and it is more preferable that all of R¹¹ to R¹⁴ represent a monovalent organic group having 1 or more carbon atoms.

Specific structures of the onium salt represented by Formula (1) will be exemplified below. Pr represents a propyl group.

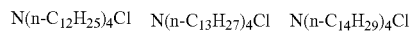
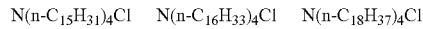
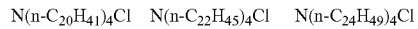
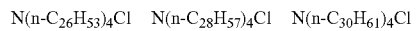
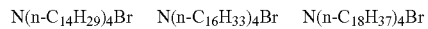
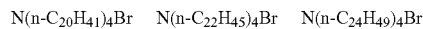
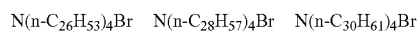
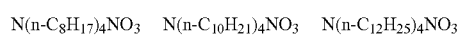
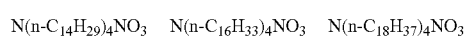
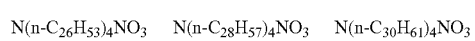
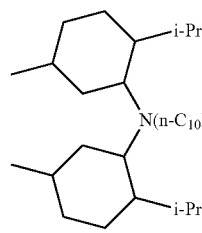
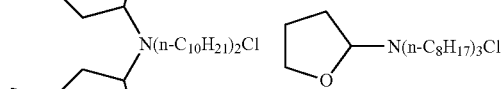
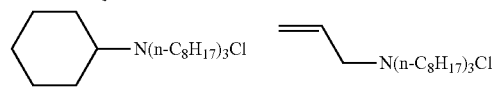
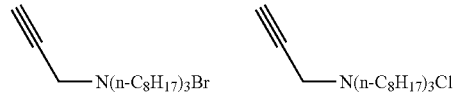
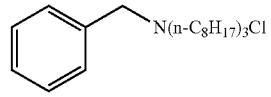
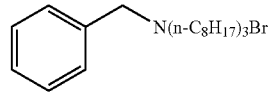
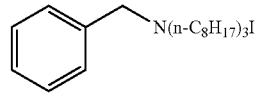

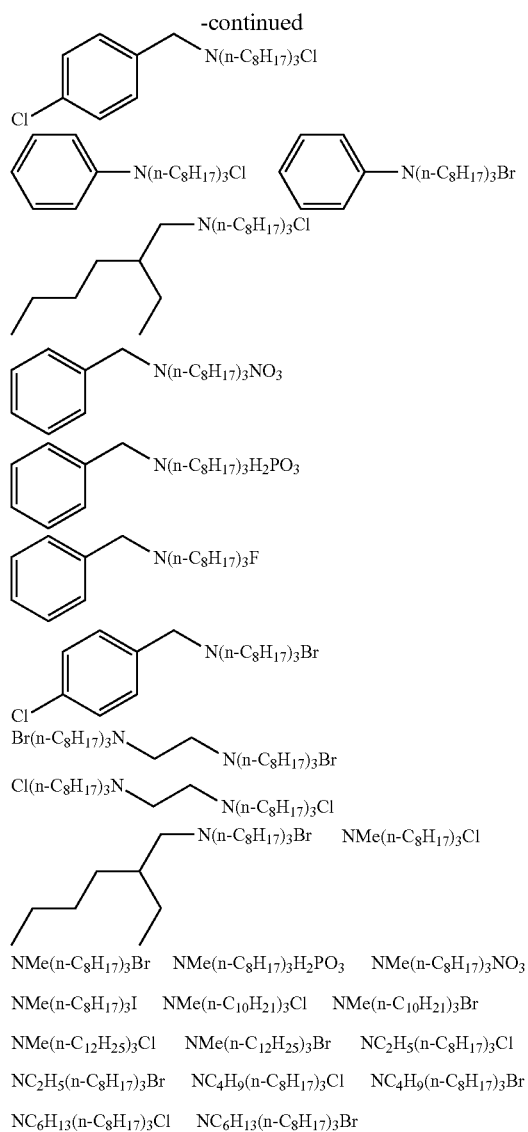

[Nanocarbon Material]

In the present invention, the nanocarbon material used as a thermoelectric conversion material is not particularly limited, and nanocarbon materials known in the related art can be used.

The size of the nanocarbon material is not particularly limited as long as it is nanosize (less than 1 μm). For example, for carbon nanotubes, carbon nanofiber, or the like which will be described later, the average minor axis thereof may be nanosized (for example, the average minor axis may be equal to or shorter than 500 nm). Furthermore, it is possible to use so-called Buckypaper which is a thin film formed of carbon nanotubes bonded to each other.

Specifically, examples of the nanocarbon material include carbon nanotubes, carbon nanobuds, carbon nanohorns, carbon nanofiber, graphite, graphene, carbon nanoparticles, and the like. One kind of these may be used singly, or two or more kinds of these may be used in combination. Among these, carbon nanotubes are preferable because they further improve the thermoelectric characteristics.

From the viewpoint of the thermoelectric conversion performance, the content of the nanocarbon material in the thermoelectric conversion layer with respect to the total solid content in the thermoelectric conversion layer is preferably 5% to 99.9% by mass, more preferably 20% to 99.9% by mass, even more preferably 40% to 99.9% by mass, and particularly preferably 60% to 99.9% by mass.

Only one kind of nanocarbon material may be used singly, or two or more kinds of nanocarbon materials may be used in combination.

The solid content described above means the components forming the thermoelectric conversion layer and does not include a solvent and a dispersant.

A rate of weight loss of the nanocarbon material in the atmosphere at 600° C. is preferably equal to or lower than 20%. The rate of weight loss can be measured by thermogravimetry-differential thermal analysis (TG-DTA) which will be described later. In order that the rate of weight loss of the nanocarbon material in the atmosphere at 600° C. falls into the above range, it is preferable to perform a heat treatment in advance on the nanocarbon material (for example, for 1 to 600 minutes (preferably 5 to 60 minutes) at 500° C. to 1,500° C. (preferably 800° C. to 1,200° C.) in a vacuum). In a case where the rate of weight loss in the atmosphere at 600° C. is equal to or lower than 20%, the purity of the nanocarbon material is further improved. Particularly, better effects are obtained compared to a case where CNT is used as a nanocarbon material.

Hereinafter, the structure of carbon nanotubes suitable in the present invention will be described.

<Carbon Nanotubes>

As the carbon nanotubes (CNT), there are single-layer CNT formed of one sheet of carbon film (graphene sheet) wound in the form of a cylinder, double-layered CNT formed of two graphene sheets wound in the form of concentric circles, and multilayered CNT formed of a plurality of graphene sheets wound in the form of concentric circles. Among these, the single-layer CNT having excellent properties in terms of semiconductor characteristics and the double-layered CNT are preferably used, and the single-layer CNT is more preferably used. In the present invention, one kind of each of the single-layer CNT, double-layered CNT, and multilayered CNT may be used singly, or two or more kinds thereof may be used in combination. It is preferable that the single-layer CNT becomes a main component (becoming a main component means that the content of the single-layer CNT with respect to the total mass of CNT is equal to or greater than 60% by mass, and the content is preferably equal to or greater than 75% by mass, more preferably equal to or greater than 90% by mass, even more preferably equal to or greater than 95% by mass, and particularly preferably equal to or greater than 99% by mass).

The single-layer CNT may be semiconductive or metallic, and both of semiconductive CNT and metallic CNT may be used in combination. Furthermore, CNT may contain a metal or the like, and CNT containing a fullerene molecule and the like (particularly, CNT containing fullerene is called pivot) may also be used.

CNT can be manufactured by an arc discharge method, a chemical vapor deposition (CVD) method, a laser ablation method, and the like. CNT used in the present invention may be obtained by any method, but it is preferable to use CNT obtained by the arc discharge method and the CVD method.

At the time of manufacturing CNT, fullerene, graphite, and/or amorphous carbon are also generated as by-products in some cases. In order to remove these by-products, CNT may be purified. The CNT purification method is not particularly limited, and examples thereof include methods such as washing, centrifugation, filtration, calcination, oxidation, and chromatography. In addition, an acid treatment using nitric acid, sulfuric acid, and the like and an ultrasonic treatment are also effective for removing the impurities. Furthermore, from the viewpoint of improving purity, it is more preferable to separate and remove the impurities by using a filter.

CNT obtained after purification can be used as it is. Generally, CNT is generated in the form of strings. Therefore, CNT may be used after being cut in a desired length according to the use. By an acid treatment using nitric acid, sulfuric acid, or the like, an ultrasonic treatment, a freezing and pulverizing method, and the like, CNT can be cut in the form of shorter fiber. From the viewpoint of improving purity, it is also preferable to collectively separate CNT by using a filter.

In the present invention, not only cut CNT but also CNT prepared in the form of short fiber can also be used.

The average length of CNT is not particularly limited. From the viewpoint of ease of manufacturing, film formability, electric conductivity, and the like, the average length is preferably 0.01 to 1,000 μm, and more preferably 0.1 to 100 μm.

The diameter of the single-layer CNT is not particularly limited. From the viewpoint of durability, film formability, electric conductivity, thermoelectric conversion performance, and the like, the diameter of the single-layer CNT is preferably equal to or greater than 0.5 nm and equal to or smaller than 4.0 nm, more preferably equal to or greater than 0.6 nm and equal to or smaller than 3.0 nm, and even more preferably equal to or greater than 0.7 nm and equal to or smaller than 2.0 nm. The diameter distribution of 70% or more of CNT (hereinafter, "diameter distribution of 70% or more" will be simply described as "diameter distribution" as well) is preferably within 3.0 nm, more preferably within 2.0 nm, even more preferably within 1.0 nm, and particularly preferably within 0.7 nm.

The diameter and the diameter distribution can be measured by the method which will be described later.

In some cases, the used CNT includes defective CNT. The defect of CNT results in the deterioration of the electric conductivity and the thermoelectromotive force of the thermoelectric conversion layer. Therefore, it is preferable to reduce the defect. The amount of the defect of CNT can be estimated by an intensity ratio G/D (hereinafter, referred to as G/D ratio) between a G-band and a D-band in a Raman spectrum. In a case where the G/D ratio is high, the CNT material can be estimated as having a small amount of defects. Particularly, in a case where single-layer CNT is used, the G/D ratio is preferably equal to or higher than 10 and more preferably equal to or higher than 30.

[Calculation of Diameter and Diameter Distribution of Single-Layer CNT]

In the present specification, the diameter of single-layer CNT is evaluated by the following method. That is, a Raman spectrum of the single-layer CNT is measured using excitation light of 532 nm (excitation wavelength: 532 nm), and by a shift ω (RBM) (cm$^{-1}$) of a radial breathing mode (RBM), the diameter of the single-layer CNT is calculated using the following calculation formula. The value calculated from a maximum peak is adopted as the diameter of CNT. The diameter distribution is obtained from the distribution of each peak top.

Calculation formula: Diameter (nm)=248/ω(RBM)

[Optional Components]

The thermoelectric conversion layer may contain other components (a dispersion medium, a polymer compound, a surfactant, an antioxidant, a thickener, an antifoaming agent, and the like) in addition to the aforementioned nanocarbon material and the onium salt represented by Formula (1). The definition, the specific examples, and the suitable aspect of each of the components are the same as those of each of the components contained in a composition for forming a thermoelectric conversion layer that will be described later.

[Manufacturing Method of Thermoelectric Conversion Layer]

The method for manufacturing a thermoelectric conversion layer is not particularly limited, and examples thereof include a first suitable aspect, a second suitable aspect, and the like described below.

<First Suitable Aspect>

The first suitable aspect of the manufacturing method of a thermoelectric conversion layer is a method of using a composition for forming a thermoelectric conversion layer containing a nanocarbon material and an onium salt represented by Formula (1).

First, the composition will be described, and then the manufacturing method will be described.

(Composition for Forming Thermoelectric Conversion Layer)

As described above, the composition for forming a thermoelectric conversion layer contains the nanocarbon material and the onium salt represented by Formula (1).

First, each of the components contained in the composition will be described, and then the preparation method of the composition will be described.

(1) Nanocarbon Material

The definition, the specific examples, and the suitable aspect of the nanocarbon material are the same as described above. The content of the nanocarbon material in the composition for forming a thermoelectric conversion layer is not particularly limited, but is preferably 5% to 99.9% by mass, more preferably 20% to 99.9% by mass, even more preferably 40% to 99.9% by mass, and particularly preferably 60% to 99.9% by mass with respect to the amount of total solid content of the composition.

(2) Onium Salt Represented by Formula (1) (Dopant)

The definition, the specific examples, and the suitable aspect of the onium salt represented by Formula (1) are as described above. The content of the onium salt represented by Formula (1) in the composition for forming a thermoelectric conversion layer is not particularly limited, but is preferably 0.1% to 50% by mass, more preferably 0.1% to 25% by mass, and particularly preferably 0.1% to 5% by mass with respect to the nanocarbon material.

(3) Dispersion Medium

It is preferable that the composition for forming a thermoelectric conversion layer contains a dispersion medium in addition to the nanocarbon material and the onium salt represented by Formula (1).

The dispersion medium (solvent) is not limited as long as it can disperse the nanocarbon material, and water, an organic solvent, and a mixed solvent of these can be used. Examples of the organic solvent include an alcohol-based solvent (for example, methanol, ethanol, propanol, butanol, methyl carbitol, butyl carbitol, 1-methoxy-2-propanol, ethylene glycol, propylene glycol, glycerin, or the like), a halogen-based solvent (for example, chloroform, dichloromethane, 1,2-dichloroethane, or the like), an aprotic polar solvent such as dimethylformamide (DMF), dimethylacetamide (DMAc), N-methylpyrrolidone (NMP), N-ethylpyrrolidone (NEP), or dimethylsulfoxide (DMSO), an aromatic solvent such as chlorobenzene, dichlorobenzene, benzene, toluene, xylene, mesitylene, tetralin, tetramethylbenzene, or pyridine, a ketone-based solvent such as cyclohexanone, acetone, methyl ethyl ketone, or isophorone, an ether-based solvent such as diethyl ether, tetrahydrofuran (THF), 1,4-dioxane, t-butyl methyl ether, cyclopentyl methyl ether, dimethoxyethane, or diglyme, an ester-based solvent such as ethyl acetate, butyl acetate, or propylene glycol 1-monomethyl ether 2-acetate, and the like.

One kind of dispersion medium can be used singly, or two or more kinds of dispersion media can be used in combination.

The content of the dispersion medium in the composition for forming a thermoelectric conversion layer with respect to the total amount of the composition is preferably 25% to 99.99% by mass, more preferably 30% to 99.95% by mass, and even more preferably 30% to 99.9% by mass.

Among these, as the dispersion medium, in view of further improving the dispersibility of the nanocarbon material and the characteristics (electric conductivity and thermoelectromotive force) of the thermoelectric conversion layer, for example, water or an alcohol-based solvent having a ClogP value equal to or smaller than 3.0 is suitable. The ClogP value can be calculated by the method which will be described later.

The alcohol-based solvent means a solvent containing a —OH group (hydroxy group).

The ClogP value of the alcohol-based solvent is equal to or smaller than 3.0. However, in view of further improving the dispersibility of the nanocarbon material and the characteristics of the thermoelectric conversion element, the ClogP value of the alcohol-based solvent is preferably equal to or smaller than 1.0. The lower limit of the ClogP value is not particularly limited. However, in view of the aforementioned effect, the lower limit is preferably equal to or greater than −3.0, more preferably equal to or greater than −2.0, and even more preferably equal to or greater than −1.0.

(Clogp Value)

A log P value means a common logarithm of a partition coefficient P. It is a physical property value showing how a certain compound is partitioned in equilibrium of two-phase system constituted with oil (herein, n-octanol) and water by using a quantitative numerical value. The greater the log P value, the more the compound is hydrophobic, and the smaller the log P value, the more the compound is hydrophilic. Therefore, the log P value can be used as a parameter showing hydrophilicity and hydrophobicity of a compound.

$$\log P = \log(C_{oil}/C_{water})$$

$C_{oil}$=molar concentration in oil phase
$C_{water}$=molar concentration in water phase Although the log P value can be generally experimentally determined using n-octanol and water, in the present invention, a partition coefficient (ClogP value) (calculated value) determined using a log P value estimation program is used. Specifically, in the present specification, a ClogP value determined using "ChemBioDraw ultra ver. 12" is used.

(4) Other Components

The composition for forming a thermoelectric conversion layer may contain a polymer compound (binder), a surfactant, an antioxidant, a thickener, an antifoaming agent, and the like in addition to the components described above.

Examples of the polymer compound include a conjugated polymer and a non-conjugated polymer. Examples of the conjugated polymer include polystyrene, polythiophene, polyolefin, polyethylenedioxythiophene/polystyrene sulfonate (PEDOT-PSS), polyaniline, polypyrrole, and the like. As the non-conjugated polymer, it is possible to use various known polymer compounds such as a vinyl compound, a (meth)acrylate compound, a carbonate compound, an ester compound, an epoxy compound, a siloxane compound, and gelatin. As the polymer compound, it is preferable to use a hydrogen bonding resin.

A hydrogen bonding functional group may be a functional group having hydrogen bonding properties. Examples thereof include a OH group, a $NH_2$ group, a NHR group (R represents an aromatic or aliphatic hydrocarbon), a COOH group, a $CONH_2$ group, a NHOH group, a $SO_3H$ group (sulfonic acid group), a —OP(=O)$OH_2$ group (phosphoric acid group), a group having a —NHCO— group, a —NH— group, a —CONHCO— bond, a —NH—NH— bond, a —C(=O)— group (carbonyl group), or a —ROR— group (ether group: R each independently represents divalent aromatic hydrocarbon a divalent aliphatic hydrocarbon; here, two R's may be the same as or different from each other), and the like.

Examples of the hydrogen bonding resin (resin having a hydrogen bonding functional group) include carboxymethyl cellulose, carboxyethyl cellulose, methyl cellulose, ethyl cellulose, hydroxymethyl cellulose, hydroxyethyl cellulose, methyl hydroxypropyl cellulose, hydroxypropyl methyl cellulose, crystalline cellulose, xanthan gum, guar gum, hydroxyethyl guar gum, carboxymethyl guar gum, gum tragacanth, locust bean gum, tamarind seed gum, psyllium seed gum, quince seeds, carrageenan, galactan, gum Arabic, pectin, pullulan, mannan, glucomannan, starch, curdlan, chondroitin sulfate, dermatan sulfate, glycogen, heparan sulfate, hyaluronic acid, keratan sulfate, chondroitin, mucoitin sulfate, dextran, keratosulfate, succinoglucan, karonin acid, alginic acid, propylene glycol alginate, macrogol, chitin, chitosan, carboxymethyl chitin, gelatin, agar, polyvinyl alcohol, polyvinyl pyrrolidone, a carboxyvinyl polymer, an alkyl-modified carboxyvinyl polymer, polyacrylic acid, an acrylic acid/alkyl methacrylate copolymer, polyethylene glycol, a (hydroxyethyl acrylate/sodium acryloyldimethyltaurate) copolymer, an (ammonium acryloyldimethyltaurate/vinyl pyrrolidone) copolymer, chemically modified starch, bentonite, and the like. In a case where the hydrogen bonding resin has an acidic group such as a carboxyl group, the hydrogen bonding resin may totally or partially become a salt such as a sodium salt, a potassium salt, or an ammonium salt.

The content of the polymer compound with respect to the mass of the nanocarbon material is preferably 0.1% to 60% by mass, more preferably 0.1% to 50% by mass, and even more preferably 0.1% to 40% by mass. The polymer compound brings about an effect of reducing the thermal conductivity by adjusting the distance between CNT.

Examples of the surfactant include known surfactants (a cationic surfactant, an anionic surfactant, and the like). Among these, an anionic surfactant is preferable, and sodium alkylbenzene sulfonate, sodium cholate, or sodium deoxycholate is more preferable. The content of the surfactant with respect to the mass of the nanocarbon material is preferably 0.01% to 2,000% by mass, more preferably 0.01% to 1,000% by mass, and even more preferably 0.01% to 500% by mass.

Examples of the antioxidant include IRGANOX 1010 (manufactured by Ciba-Geigy Japan Limited), SUMILIZER GA-80 (manufactured by Sumitomo Chemical Co., Ltd.), SUMILIZER GS (manufactured by Sumitomo Chemical Co., Ltd), SUMILIZER GM (manufactured by Sumitomo Chemical Co., Ltd.), ascorbic acid, and the like. The content of the antioxidant with respect to the total mass of the composition for forming a thermoelectric conversion layer is preferably 0.1% to 10% by mass, and more preferably 0.1% to 5% by mass.

The antifoaming agent is not particularly limited as long as it reduces the surface tension of the composition for forming a thermoelectric conversion layer and has affinity with a solvent. Examples of the antifoaming agent include high-acid-value oil-based compound, a fatty acid ester-based compound, a fluorine-based compound, a silicone-based compound, and the like. The antifoaming agent which has low affinity with a solvent can be used as an emulsion. One kind of antifoaming agent may be used singly, or two or more kinds of antifoaming agents may be used by being mixed together. The content of the antifoaming agent with respect to the total mass of the composition for forming a thermoelectric conversion layer is preferably 0.0001% to 10% by mass, more preferably 0.001% to 5% by mass, and even more preferably 0.005% to 1% by mass.

Examples of the thickener include the aforementioned hydrogen bonding resin and the like. The thickener also brings about an effect of reducing the thermal conductivity by adjusting the distance between CNT.

(Preparation Method of Composition for Forming Thermoelectric Conversion Layer)

The composition for forming a thermoelectric conversion layer can be prepared by mixing together the components described above. The composition is preferably prepared by mixing together the dispersion medium the nanocarbon material, the onium salt represented by Formula (1), and other components which are used if desired, and dispersing the nanocarbon material.

The preparation method of the composition is not particularly limited, and can be performed using a general mixing device or the like at room temperature under normal pressure. For example, the composition may be prepared by dissolving or dispersing the components in a solvent by means of stirring, shaking, or kneading. In order to accelerate the dissolution or dispersion, an ultrasonic treatment may be performed.

Furthermore, it is possible to improve the dispersibility of the nanocarbon material by means of heating the solvent to a temperature that is equal to or higher than room temperature and equal to or lower than the boiling point in the aforementioned dispersion step, extending the dispersion time, increasing the intensity of stirring, shaking, kneading, or ultrasonic waves applied, and the like.

(Manufacturing Method)

The method for manufacturing a thermoelectric conversion layer by using the composition for forming a thermoelectric conversion layer is not particularly limited, and examples thereof include a method for forming a film by coating a substrate with the aforementioned composition.

The film-forming method is not particularly limited, and it is possible to use known coating methods such as a spin coating method, an extrusion die coating method, a blade coating method, a bar coating method, a screen printing method, a stencil printing method, a roll coating method, a curtain coating method, a spray coating method, a dip coating method, and an ink jet method. The film can be formed not only by filtering the dispersion composition under reduced pressure or filtering the dispersion composition under pressure but by casting the composition into a mold.

If necessary, a drying step is performed after coating. For example, by heating the thermoelectric conversion layer from the substrate side or by blowing hot air to the thermoelectric conversion layer, the solvent can be volatilized or dried. The drying may be performed under reduced pressure or in an inert atmosphere.

In a case where the composition contains a dispersant or a surfactant, it is preferable to additionally perform a step of removing the dispersant or the surfactant after the film is formed. The removal of the dispersant or the surfactant can be performed by washing the film with a solvent that dissolves the dispersant or the surfactant, and the like.

From the viewpoint of improving the film density of the thermoelectric conversion layer, it is preferable to perform a pressing treatment (preferably with a pressing force of about 3 to 20 kN and more preferably with a pressing force of about 5 to 20 kN) on the film obtained after drying. The method of the pressing treatment is not particularly limited, and the treatment can be performed by roll pressing and the like.

<Second Suitable Aspect>

The second suitable aspect of the manufacturing method of a thermoelectric conversion layer is a method of preparing a thermoelectric conversion layer precursor by using a composition for forming a thermoelectric conversion layer precursor containing a nanocarbon material and then applying the onium salt represented by Formula (1) to the thermoelectric conversion layer precursor such that the nanocarbon material is doped.

First, the composition will be described, and then the manufacturing method will be described.

(Composition for Forming Thermoelectric Conversion Layer Precursor)

As described above, the composition for forming a thermoelectric conversion layer precursor contains a nanocarbon material. The definition, the specific examples, and the suitable aspect of the nanocarbon material are as described above. The suitable aspect of the content of the nanocarbon material in the composition is the same as that in the first suitable aspect described above.

It is preferable that the composition for forming a thermoelectric conversion layer precursor contains a dispersion medium in addition to the nanocarbon material. Specific examples and suitable aspects of the dispersion medium are the same as those in the first suitable aspect described above.

The composition for forming a thermoelectric conversion layer precursor may further contain other components. Specific examples and suitable aspects of those other components are the same as those in the first suitable aspect described above.

(Manufacturing Method)

The method for manufacturing a thermoelectric conversion layer precursor by using the composition for forming a thermoelectric conversion layer precursor is not particularly limited, and specific examples and suitable aspects of the method are the same as those in the manufacturing method of a thermoelectric conversion layer of the first suitable aspect described above.

In the second suitable aspect, after a thermoelectric conversion layer precursor is prepared, by using the onium salt represented by Formula (1) as a dopant, the nanocarbon material is doped to become an n-type. In this way, a thermoelectric conversion layer is obtained.

The doping method for change to an n-type is not particularly limited, and examples thereof include a method of immersing the thermoelectric conversion layer precursor in a solution (dopant-containing solution) obtained by dissolving the aforementioned onium salt in a solvent, and the like.

The solvent is not particularly limited as long it is a solvent dissolving the onium salt, and can be appropriately selected according to the solubility (particularly, a substituent) of the onium salt. For example, water, various organic solvents, or a mixed solvent of these can be used. Specific examples of the solvent are the same as the examples of the dispersion medium described above.

The concentration of the onium salt in the dopant-containing solution is preferably 0.01 to 10,000 mmol/L, more preferably 0.1 to 1,000 mmol/L, and even more preferably 1 to 100 mmol/L.

After the doping for change to an n-type, if necessary, a drying step is performed. For example, by heating the thermoelectric conversion layer from the substrate side or by blowing hot air to the thermoelectric conversion layer, the solvent can be volatilized and dried. The drying may be performed under reduced pressure or in an inert atmosphere.

[Thickness]

From the viewpoint of improving the thermoelectric conversion performance and the like, the average thickness of the thermoelectric conversion layer is preferably 1 to 500 µm, more preferably 5 to 500 µm, and even more preferably 10 to 500 µm.

The average thickness of the thermoelectric conversion layer is determined by measuring the thickness of the thermoelectric conversion layer at random 10 points and calculating the arithmetic mean thereof.

[Film Density]

The film density of the thermoelectric conversion layer is preferably equal to or higher than 0.45 gcm$^{-3}$, and more preferably equal to or higher than 0.7 gcm$^{-3}$. The film density of the thermoelectric conversion layer can be calculated by dividing the weight of the thermoelectric conversion layer by the volume of the thermoelectric conversion layer.

By improving the film density, the electric conductivity G, and the figure of merit Z are further improved.

[Degree of Alignment]

In a case where CNT is used as the nanocarbon material, a degree of horizontal alignment of CNT in the thermoelectric conversion layer is preferably equal to or higher than 1.5, more preferably equal to or higher than 2.0, even more preferably equal to or higher than 2.4, and particularly preferably equal to or higher than 2.5. A degree of in-plane alignment of CNT is preferably equal to or higher than 1.0, and more preferably equal to or higher than 1.2. The degree of horizontal alignment and the degree of in-plane alignment of CNT in the thermoelectric conversion layer can be measured by the polarized Raman method which will be described later. Examples of the method for obtaining a degree of alignment within the above range include a method of applying shear force at the time of forming a film, a method of applying a magnetic field or an electric field at the time of forming a film (liquid crystals accelerating alignment and the like may be added), a method of using a substrate having undergone a rubbing treatment, a method of performing stretching or minor axis compression after a film is formed, and the like.

[Thermoelectric Conversion Element and Thermoelectric Conversion Module]

The constitution of the thermoelectric conversion element of the embodiment of the present invention is not particularly limited as long as the thermoelectric conversion element comprises the aforementioned thermoelectric conversion layer. For example, in an aspect, the thermoelectric conversion element of the embodiment of the present invention comprises the aforementioned thermoelectric conversion layer and an electrode pair which is electrically connected to the thermoelectric conversion layer. It is preferable that the thermoelectric conversion element of the embodiment of the present invention comprises the aforementioned thermoelectric conversion layer of the embodiment of the present invention as an n-type thermoelectric conversion layer.

The constitution of the thermoelectric conversion module of the embodiment of the present invention is not particularly limited as long as the thermoelectric conversion module comprises a plurality of the thermoelectric conversion elements described above.

Hereinafter, regarding the thermoelectric conversion element of the embodiment of the present invention in which the thermoelectric conversion layer of the embodiment of the present invention is used as an n-type thermoelectric conversion layer and the thermoelectric conversion module comprising a plurality of the thermoelectric conversion elements described above, a suitable aspect of each of the thermoelectric conversion element and the thermoelectric conversion module will be specifically described.

In the following description, the thermoelectric conversion layer of the embodiment of the present invention will be simply referred to as "n-type thermoelectric conversion layer".

In the thermoelectric conversion element of the embodiment of the present invention, the thermoelectric conversion layer may include only the aforementioned n-type thermoelectric conversion layer or comprise the aforementioned n-type thermoelectric conversion layer and a p-type thermoelectric conversion layer electrically connected to the n-type thermoelectric conversion layer. As long as the n-type thermoelectric conversion layer and the p-type thermoelectric conversion layer are electrically connected to each other, these layers may directly contact each other, or a conductor (for example, an electrode) may be disposed between the layers.

First Embodiment

FIG. 1 is a cross-sectional view of a first embodiment of the thermoelectric conversion element of the present invention.

A thermoelectric conversion element 110 shown in FIG. 1 comprises a first substrate 12, a pair of electrodes including a first electrode 13 and a second electrode 15 on the first substrate 12, and an n-type thermoelectric conversion layer 14 which is between the first electrode 13 and the second electrode 15 and contains a nanocarbon material and an onium salt represented by Formula (1). On the other surface of the second electrode 15, a second substrate 16 is disposed. On the outside of the first substrate 12 and the second substrate 16, metal plates 11 and 17 facing each other are disposed.

Second Embodiment

Figure 2:
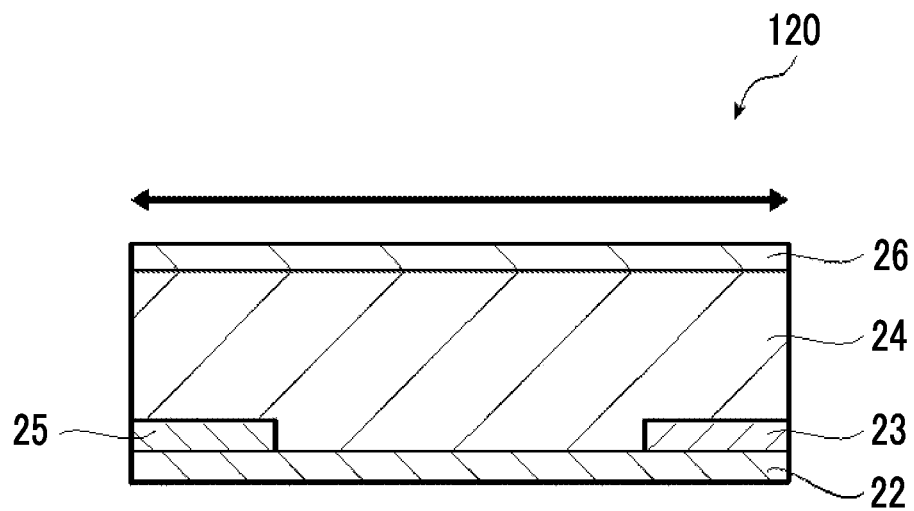
FIG. 2 is a cross-sectional view of a second embodiment of the thermoelectric conversion element of the present invention.

FIG. 2 is a cross-sectional view of a second embodiment of the thermoelectric conversion element of the present invention.

A thermoelectric conversion element 120 shown in FIG. 2 is provided with a first substrate 22, a first electrode 23 and a second electrode 25 on the first substrate 22, and an n-type thermoelectric conversion layer 24 which is on the electrodes and contains a nanocarbon material and an onium salt represented by Formula (1). The other surface of the n-type thermoelectric conversion layer 24 is provided with a second substrate 26.

Third Embodiment

Figure 3A:
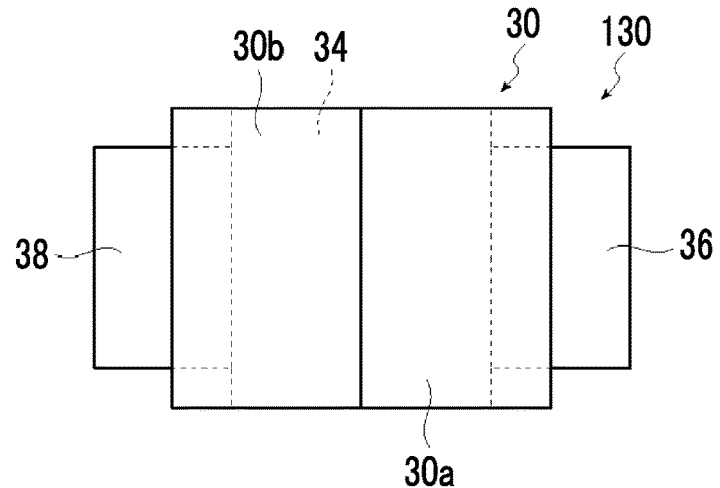
FIG. 3A is a conceptual view (top view) of a third embodiment of the thermoelectric conversion element of the present invention.
Figure 3B:
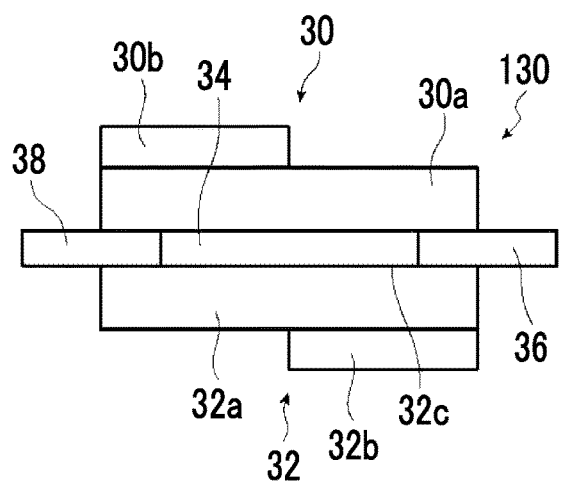
FIG. 3B is a conceptual view (front view) of the third embodiment of the thermoelectric conversion element of the present invention.
Figure 3C:
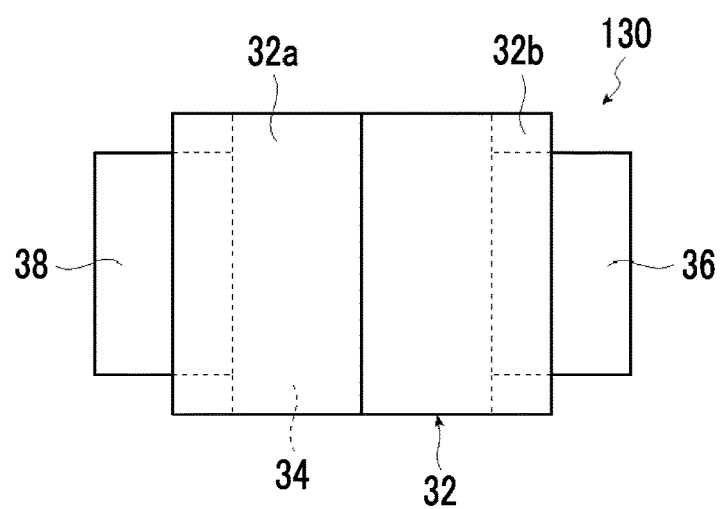
FIG. 3C is a conceptual view (bottom view) of the third embodiment of the thermoelectric conversion element of the present invention.

FIGS. 3A to 3C conceptually show a third embodiment of the thermoelectric conversion element of the present invention. FIG. 3A is a top view (a drawing obtained in a case where FIG. 3B is viewed from above the paper), FIG. 3B is a front view (a drawing obtained in a case where the thermoelectric conversion element is viewed from the plane direction of a substrate, which will be described later, and the like), and FIG. 3C is a bottom view (a drawing obtained in a case where FIG. 3B is viewed from the bottom of the paper).

As shown in FIGS. 3A to 3C, a thermoelectric conversion element 130 is basically constituted with a first substrate 32, an n-type thermoelectric conversion layer 34 containing a nanocarbon material and an onium salt represented by Formula (1), a second substrate 30, a first electrode 36, and a second electrode 38.

Specifically, on a surface of the first substrate 32, the n-type thermoelectric conversion layer 34 is formed. Furthermore, on the surface of the first substrate 32, the first electrode 36 and the second electrode 38 (electrode pair) are formed which contact the n-type thermoelectric conversion layer 34 interposed between the electrodes in a substrate surface direction of the first substrate 32 (hereinafter, the substrate surface direction will be simply referred to as "plane direction" as well which is in other words a direction orthogonal to the direction along which the first substrate 32 and the second substrate 30 are laminated).

A pressure sensitive adhesive layer may be disposed between the first substrate 32 and the n-type thermoelectric conversion layer 34 or between the second substrate 30 and the n-type thermoelectric conversion layer 34, although the pressure sensitive adhesive layer is not shown in FIGS. 3A to 3C.

As shown in FIGS. 3A to 3C, the first substrate 32 includes a low thermal conduction portion 32a and a high thermal conduction portion 32b having a thermal conductivity higher than that of the low thermal conduction portion 32a. Likewise, the second substrate 30 includes a low thermal conduction portion 30a and a high thermal conduction portion 30b having a thermal conductivity higher than that of the low thermal conduction portion 30a.

In the thermoelectric conversion element 130, the two substrates are disposed such that the high thermal conduction portions thereof are in different positions in a direction along which the first electrode 36 and the second electrode 38 are spaced apart from each other (that is, a direction along which electricity is conducted).

In a preferable aspect, the thermoelectric conversion element 130 has the second substrate 30 bonded through a pressure sensitive adhesive layer, and both the first substrate 32 and the second substrate 30 have a low thermal conduction portion and a high thermal conduction portion. The thermoelectric conversion element 130 has a constitution in which two sheets of substrates each having a high thermal conduction portion and a low thermal conduction portion are used such that the thermoelectric conversion layer is interposed between the two sheets of substrates in a state where the high thermal conduction portions of the two substrates are in different positions in the plane direction.

That is, the thermoelectric conversion element 130 is a thermoelectric conversion element which converts thermal energy into electric energy by causing a temperature difference in the plane direction of the thermoelectric conversion layer (hereinafter, the thermoelectric conversion element will be referred to as in plane-type thermoelectric conversion element as well). In the example illustrated in the drawing, by using a substrate including a low thermal conduction portion and a high thermal conduction portion having a thermal conductivity higher than that of the low thermal conduction portion, a temperature difference can be caused in the plane direction of the n-type thermoelectric conversion layer 34, and thermal energy can be converted into electric energy.

Fourth Embodiment

Figure 4:
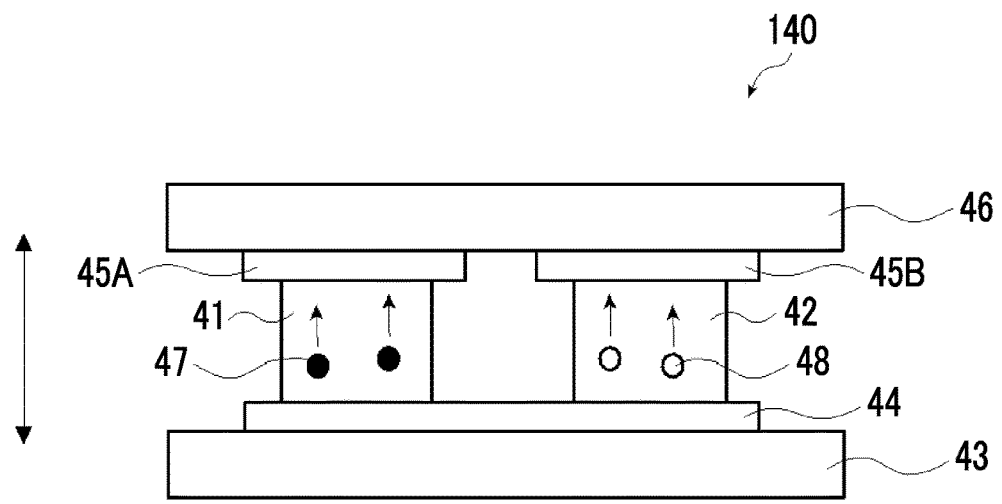
FIG. 4 is a conceptual view of a fourth embodiment of the thermoelectric conversion element of the present invention.

FIG. 4 conceptually shows a fourth embodiment of the thermoelectric conversion element.

A thermoelectric conversion element 140 shown in FIG. 4 has a p-type thermoelectric conversion layer (p-type thermoelectric conversion portion) 41 and an n-type thermoelectric conversion layer (n-type thermoelectric conversion portion) 42, and these layers are disposed in parallel to each other. The n-type thermoelectric conversion layer 42 is an n-type thermoelectric conversion layer containing a nanocarbon material and an onium salt represented by Formula (1). The constitution of the p-type thermoelectric conversion layer 41 and the n-type thermoelectric conversion layer 42 will be specifically described later.

An upper end portion of the p-type thermoelectric conversion layer 41 is electrically and mechanically connected to a first electrode 45A, and an upper end portion of the n-type thermoelectric conversion layer 42 is electrically and mechanically connected to a third electrode 45B. On the outside of the first electrode 45A and the third electrode 45B, an upper substrate 46 is disposed. A lower end portion of each of the p-type thermoelectric conversion layer 41 and the n-type thermoelectric conversion layer 42 is electrically and mechanically connected to a second electrode 44 supported on a lower substrate 43. In this way, the p-type thermoelectric conversion layer 41 and the n-type thermoelectric conversion layer 42 are connected to each other in series through the first electrode 45A, the second electrode 44, and the third electrode 45B. That is, the p-type thermoelectric conversion layer 41 and the n-type thermoelectric conversion layer 42 are electrically connected to each other through the second electrode 44.

The thermoelectric conversion element 140 makes a temperature difference (in the direction of the arrow in FIG. 4) between the upper substrate 46 and the lower substrate 43 such that, for example, the upper substrate 46 side becomes a low-temperature portion and the lower substrate 43 side becomes a high-temperature portion. In a case where such a temperature difference is made, in the interior of the p-type thermoelectric conversion layer 41, a hole 47 carrying a positive charge moves to the low-temperature portion side (upper substrate 46 side), and the potential of the second electrode 45A becomes higher than that of the first electrode 44. In contrast, in the interior of the n-type thermoelectric conversion layer 42, an electron 48 carrying a negative charge moves to the low-temperature portion side (upper substrate 46 side), and the potential of the second electrode 44 becomes higher than that of the third electrode 45B. Consequently, a potential difference occurs between the first electrode 45A and the third electrode 45B, and for example, in a case where a load is connected to the end of the electrode, electric power can be extracted. At this time, the first electrode 45A becomes a positive electrode, and the third electrode 45B becomes a negative electrode.

Fifth Embodiment

Figure 5:
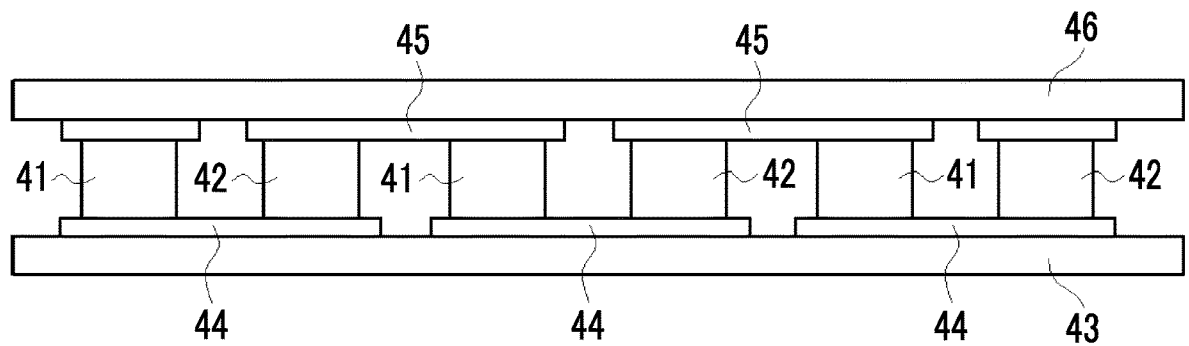
FIG. 5 is a conceptual view of a fifth embodiment of the thermoelectric conversion element of the present invention.

The thermoelectric conversion element 140 can obtain a higher voltage by, for example, alternately disposing a plurality of p-type thermoelectric conversion layers 41, 41 . . . and a plurality of n-type thermoelectric conversion layers 42, 42, . . . and connecting them to each other in series through the first and third electrodes 45 and the second electrode 44, as shown in FIG. 5.

As shown in FIG. 5, in the present invention, a plurality of thermoelectric conversion elements may be electrically connected to each other so as to constitute a so-called module (thermoelectric conversion module).

Hereinafter, each of the members constituting the thermoelectric conversion element will be specifically described.

[Substrate]

As the substrates in the thermoelectric conversion element (the first substrate 12 and the second substrate 16 in the first embodiment, the first substrate 22 and the second substrate 26 in the second embodiment, the low thermal conduction portions 32a and 30a in the third embodiment, the high thermal conduction portions 32b and 30b in the third embodiment, and the upper substrate 46 and the lower substrate 43 in the fourth embodiment), substrates such as glass, transparent ceramics, and a plastic film can be used. In the thermoelectric conversion element of the embodiment of the present invention, it is preferable that the substrate has flexibility. Specifically, it is preferable that the substrate has such flexibility that the substrate is found to have an MIT folding endurance equal to or greater than 10,000 cycles by a measurement method specified by ASTM D2176. As the substrate has such flexibility, a plastic film is preferable, and specific examples thereof include a polyester film such as polyethylene terephthalate, polyethylene isophthalate, polyethylene naphthalate, polybutylene terephthalate, poly(1,4-cyclohexylenedimethyleneterephthalate), polyethylene-2,6-naphthalenedicarboxylate, or a polyester film of bisphenol A and isophthalic and terephthalic acids, a polycycloolefin film such as a ZEONOR film (trade name, manufactured by ZEON CORPORATION), an ARTON film (trade name, manufactured by JSR Corporation), or SUMILITE FS1700 (trade name, manufactured by Sumitomo Bakelite Co. Ltd.), a polyimide film such as KAPTON (trade name, manufactured by DU PONT-TORAY CO., LTD.), APICAL (trade name, manufactured by Kaneka Corporation), UPILEX (trade name, manufactured by UBE INDUSTRIES, LTD.), or POMIRAN (trade name, manufactured by Arakawa Chemical Industries, Ltd.), a polycarbonate film such as PUREACE (trade name, manufactured by TEIJIN LIMITED) or ELMEC (trade name, manufactured by Kaneka Corporation), a polyether ether ketone film such as SUMILITE FS1100 (trade name, manufactured by Sumitomo Bakelite Co. Ltd.), a polyphenyl sulfide film such as TORELINA (trade name, manufactured by TORAY INDUSTRIES, INC.), and the like. From the viewpoint of ease of availability, heat resistance (preferably equal to or higher than 100° C.), economic feasibility, and effects, commercial polyethylene terephthalate, polyethylene naphthalate, various polyimide or polycarbonate films, and the like are preferable.

In view of handleability, durability, and the like, the thickness of the substrate is preferably 5 to 3,000 μm, more preferably 5 to 500 m, even more preferably 5 to 100 μm, and particularly preferably 5 to 50 μm. In a case where the thickness of the substrate is within the above range, a temperature difference can be effectively caused in the thermoelectric conversion layer, and the thermoelectric conversion layer is not easily damaged due to an external shock.

[Electrode]

Examples of electrode materials forming the electrodes in the thermoelectric conversion element include a transparent electrode material such as Indium-Tin-Oxide (ITO) or ZnO, a metal electrode material such as silver, copper, gold, or aluminum, a carbon material such as CNT or graphene, and an organic material such as poly(3,4-ethylenedioxythiophene) (PEDOT)/polystyrene sulfonate (PSS), or PEDOT/tosylate (Tos). The electrodes can be formed using a conductive paste in which conductive fine particles of gold, silver, copper, or carbon are dispersed, solder, a conductive paste containing metal nanowires of gold, silver, copper, or aluminum, and the like.

[p-Type Thermoelectric Conversion Layer]

As the p-type thermoelectric conversion layer included in the thermoelectric conversion element of the fourth embodiment, a known p-type thermoelectric conversion layer can be used. As materials contained in the p-type thermoelectric conversion layer, known materials (for example, a composite oxide such as $NaCo_2O_4$ or $Ca_3Co_4O_9$, silicide such as $MnSi_{1.73}$, $Fe_{1-x}Mn_xSi_2$, $Si_{0.8}Ge_{0.2}$, or $\beta\text{-}FeSi_2$, skutterudite such as $CoSb_3$, $FeSb_3$, or $RFe_3CoSb_{12}$ (R represents La, Ce, or Yb), and a Te-containing alloy such as BiTeSb, PbTeSb, $Bi_2Te_3$, or PbTe), CNT, poly(3,4-ethylenedioxythiophene) (PEDOT)/polystyrene sulfonate (PSS), PEDOT/tosylate (Tos), polythiophene, polyaniline, and the like are appropriately used.

The formation method (manufacturing method) of the n-type thermoelectric conversion layer can be the same as the manufacturing method of the thermoelectric conversion layer of the embodiment of the present invention described above, and specific examples thereof are as described above.

[Article for Thermoelectric Power Generation]

The article for thermoelectric power generation of the present invention is an article for thermoelectric power generation using the thermoelectric conversion element of the embodiment of the present invention.

Specific examples of the article for thermoelectric power generation include a power generator such as a hot spring heat power generator, a solar power generator, or a waste heat power generator, a power supply such as a power supply for a wristwatch, a power supply for driving a semiconductor, or a power supply for a small sensor, and the like. In addition, the article for thermoelectric power generation of the present invention can also be used as a Peltier element for cooling, temperature control, and the like.

That is, the aforementioned thermoelectric conversion element of the embodiment of the present invention described above can be suitably used for the above uses.

[Composition for Forming n-Type Semiconductor Layer]

Various components contained in the composition for forming an n-type semiconductor layer of the embodiment of the present invention are the same as the components contained in the aforementioned composition for forming a thermoelectric conversion layer.

The composition for forming a thermoelectric conversion layer as an aspect of the composition for forming an n-type semiconductor layer was described above, but the composition can be used for other uses.

EXAMPLES

Hereinafter, the present invention will be more specifically described based on examples. The materials, the amount and the ratio of the materials used, the details of a treatment, the procedure of a treatment, and the like shown in the following examples can be appropriately changed as long as the gist of the present invention is maintained. Therefore, the scope of the present invention is not limited to the following examples.

1. Preparation and evaluation of CNT films of Examples 1 to 22 and Comparative Examples 1 to 6

[Preparation of CNT Film]

Example 1

By using a mechanical homogenizer (manufactured by SMT Corporation, HIGH-FLEX HOMOGENiZER HF93), 400 mg of single-layer CNT (Tuball manufactured by OCSiAl) and 400 mL of acetone were mixed together for 5 minutes at 18,000 rpm, thereby obtaining a dispersion liquid. The dispersion liquid was filtered under reduced pressure by using a Buchner funnel equipped with filter paper (diameter: 125 mm) and a suction bottle, thereby obtaining a CNT film. The obtained CNT film was dried for 30 minutes at 50° C. and then for 30 minutes at 120° C., and then the cloth-like CNT film was cut in a size of about 1 cm×1 cm.

The obtained 1 cm×1 cm CNT film was immersed in 5.3 mL of a methanol solution (dopant-containing solution) containing 9.4 mM methyl trioctylammonium chloride (manufactured by TOKYO CHEMICAL INDUSTRY CO., LTD.). The CNT film was immersed in the dopant-containing solution for 2 hours at 25° C., then pulled up, and rinsed with methanol. The rinsed CNT film was dried for 2 hours at 30° C. in a vacuum, thereby obtaining an n-type CNT film.

Example 2

By using a ball mill, 400 mg of single-layer CNT (Tuball manufactured by OCSiAl), 100 mg of polystyrene, and 20 mL of o-dichlorobenzene were dispersed, thereby preparing a dispersion liquid. A portion of the obtained dispersion liquid was cast into a mold (3×4 cm) installed on a glass substrate, thereby forming a film. The obtained glass substrate was dried for 3 hours at 250° C., and then the obtained film was peeled from the glass substrate and cut in a size of about 1 cm×1 cm. Thereafter, the same preparation process as that in Example 1 was performed, thereby obtaining an n-type CNT film.

Example 3

An n-type CNT film was obtained by the same preparation process as that in Example 1, except that single-layer CNT (Tuball manufactured by OCSiAl) having undergone a calcination treatment for 30 minutes at 1,000° C. in a vacuum was used.

Example 4

An n-type CNT film was obtained by the same preparation process as that in Example 1, except that the single-layer CNT (Tuball manufactured by OCSiAl) was changed to single-layer CNT (EC 1.5 manufactured by Meijo Nano Carbon).

Example 5

An n-type CNT film was obtained by the same preparation process as that in Example 4, except that the CNT film obtained after drying was subjected to a roll pressing treatment (3 kN).

Example 6

An n-type CNT film was obtained by the same preparation process as that in Example 4, except that the CNT film obtained after drying was subjected to a roll pressing treatment (20 kN).

Example 7

An n-type CNT film was obtained by the same preparation process as that in Example 4, except that a cloth-like CNT film (buckypaper) was used in which a degree of alignment was improved based on the method described in Carbon 2014, 93, 2157.

Example 8

By using a mechanical homogenizer (manufactured by SMT Corporation, HIGH-FLEX HOMOGENiZER HF93), 500 mg of single-layer CNT (EC 1.5 manufactured by Meijo Nano Carbon) and 500 mL of acetone were mixed together for 5 minutes at 18,000 rpm, thereby obtaining a dispersion liquid. By using the dispersion liquid, a CNT film was prepared in which a degree of alignment was improved based on the method described in Carbon 2014, 93, 2157. The obtained cloth-like CNT film was cut in a size of about 1 cm×1 cm.

The obtained 1 cm×1 cm CNT film was immersed in 5.3 mL of a methanol solution containing 9.4 mM methyl trioctylammonium chloride (manufactured by TOKYO CHEMICAL INDUSTRY CO., LTD.). The CNT film was immersed in the dopant-containing solution for 2 hours at 25° C., then pulled up, and rinsed with methanol. The rinsed CNT film was dried for 2 hours at 30° C. in a vacuum, and then the dried CNT film was subjected to a roll pressing treatment (20 kN), thereby obtaining an n-type CNT film.

Example 9

An n-type CNT film was obtained by the same preparation process as that in Example 1, except that the methyl trioctylammonium chloride was changed to tetraoctyl ammonium chloride ($N(C_8H_{17})_4Cl$, manufactured by Sigma-Aldrich Co. LLC.).

Example 10

An n-type CNT film was obtained by the same preparation process as that in Example 8, except that the methyl trioctylammonium chloride was changed to tetraoctyl ammonium chloride ($N(C_8H_{17})_4Cl$, manufactured by Sigma-Aldrich Co. LLC.).

Example 11

An n-type CNT film was obtained by the same preparation process as that in Example 1, except that the methyl trioctylammonium chloride was changed to tetraoctyl ammonium bromide ($N(C_8H_{17})_4Br$, manufactured by Sigma-Aldrich Co. LLC.).

Example 12

An n-type CNT film was obtained by the same preparation process as that in Example 8, except that the methyl trioctylammonium chloride was changed to tetraoctyl ammonium bromide (N(C$_8$H$_{17}$)$_4$Br, manufactured by Sigma-Aldrich Co. LLC.).

Example 13

An n-type CNT film was obtained by the same preparation process as that in Example 1, except that the methyl trioctylammonium chloride was changed to tetraoctyl ammonium iodide (N(C$_8$H$_{17}$)$_4$I, manufactured by TOKYO CHEMICAL INDUSTRY CO., LTD.).

Example 14

An n-type CNT film was obtained by the same preparation process as that in Example 8, except that the methyl trioctylammonium chloride was changed to tetraoctyl ammonium iodide (N(C$_8$H$_{17}$)$_4$I, manufactured by TOKYO CHEMICAL INDUSTRY CO., LTD.).

Example 15

An n-type CNT film was obtained by the same preparation process as that in Example 1, except that the methyl trioctylammonium chloride was changed to tetraethyl ammonium fluoride (N(C$_2$H$_5$)$_4$F, manufactured by TOKYO CHEMICAL INDUSTRY CO., LTD.).

Example 16

An n-type CNT film was obtained by the same preparation process as that in Example 8, except that the methyl trioctylammonium chloride was changed to tetraethyl ammonium fluoride (N(C$_2$H$_5$)$_4$F, manufactured by TOKYO CHEMICAL INDUSTRY CO., LTD.).

Example 17

An n-type CNT film was obtained by the same preparation process as that in Example 1, except that the methyl trioctylammonium chloride was changed to tetramethyl ammonium fluoride (NMe$_4$F, manufactured by TOKYO CHEMICAL INDUSTRY CO., LTD.).

Example 18

An n-type CNT film was obtained by the same preparation process as that in Example 8, except that the methyl trioctylammonium chloride was changed to tetramethyl ammonium fluoride (NMe$_4$F, manufactured by TOKYO CHEMICAL INDUSTRY CO., LTD.).

Example 19

An n-type CNT film was obtained by the same preparation process as that in Example 1, except that the methyl trioctylammonium chloride was changed to tetraoctyl ammonium nitrate (N(C$_8$H$_7$)$_4$NO$_3$, synthesized according to the method described in WO2012/156540A2).

Example 20

An n-type CNT film was obtained by the same preparation process as that in Example 8, except that the methyl trioctylammonium chloride was changed to tetraoctyl ammonium nitrate (N(C$_8$H$_{17}$)$_4$NO$_3$, synthesized according to the method described in WO2012/156540A2).

Example 21

An n-type CNT film was obtained by the same preparation process as that in Example 1, except that the methyl trioctylammonium chloride was changed to tetrahexylammonium phosphate (N(C$_6$H$_{13}$)$_4$H$_2$PO$_4$, manufactured by Sigma-Aldrich Co. LLC.).

Example 22

An n-type CNT film was obtained by the same preparation process as that in Example 8, except that the methyl trioctylammonium chloride was changed to tetrahexylammonium phosphate (N(C$_6$H$_{13}$)$_4$H$_2$PO$_4$, manufactured by Sigma-Aldrich Co. LLC.).

Comparative Example 1

An n-type CNT film was obtained by the same preparation process as that in Example 1, except that the methyl trioctylammonium chloride was changed to tetrabutylammonium hydroxide (N(C$_4$H$_9$)$_4$OH, manufactured by TOKYO CHEMICAL INDUSTRY CO., LTD.).

Comparative Example 2

A CNT film was obtained by the same preparation process as that in Example 1, except that the methyl trioctylammonium chloride was changed to tetramethylammonium chloride (NMe$_4$Cl, manufactured by TOKYO CHEMICAL INDUSTRY CO., LTD.). As a result of measuring the Seebeck coefficient, the obtained CNT film was found to be a p-type.

Comparative Example 3

A CNT film was obtained by the same preparation process as that in Example 1, except that the methyl trioctylammonium chloride was changed to tetrapentylammonium chloride (N(C$_8$H$_{11}$)$_4$Cl, manufactured by Sigma-Aldrich Co. LLC.). As a result of measuring the Seebeck coefficient, the obtained CNT film was found to be a p-type.

Comparative Example 4

An n-type CNT film was obtained by the same preparation process as that in Example 1, except that the methyl trioctylammonium chloride was changed to tetrahexylammonium chloride (N(C$_6$H$_{13}$)$_4$Cl, manufactured by Sigma-Aldrich Co. LLC.).

Comparative Example 5

An n-type CNT film was obtained by the same preparation process as that in Example 1, except that the methyl trioctylammonium chloride was changed to trimethyl tetradecylammonium chloride (NMe$_3$(C$_{14}$H$_{29}$)Cl, manufactured by TOKYO CHEMICAL INDUSTRY CO., LTD.).

Comparative Example 6

A CNT film was obtained by the same preparation process as that in Example 1, except that the methyl trioctylammonium chloride was changed to tetraethylammonium iodide chloride (N(C$_2$H$_5$)$_4$I, manufactured by TOKYO CHEMICAL INDUSTRY CO., LTD.). As a result of measuring the Seebeck coefficient, the CNT film was found to be a p-type.

[Measurement of Rate of Weight Loss of Nanocarbon Material (CNT) at 600° C.]

The rate of weight loss, shown in Table 1, of the nanocarbon material (CNT) at 600° C. used in examples and comparative examples was determined by thermogravimetry-differential thermal analysis (TG-DTA).

Specifically, according to the following measurement condition, the rate of weight loss at 600° C. was calculated by TG-DTA and evaluated based on the following standards. The rate of weight loss at 600° C. was calculated by the following formula.

Rate of weight loss at 600° C. (%)=(weight of nanocarbon material after being kept at 100° C. for 120 minutes−weight of nanocarbon material at 600° C.)/(weight of nanocarbon material after being kept at 100° C. for 120 minutes)×100

Each of "weight of nanocarbon material after being kept at 100° C. for 120 minutes" and "weight of nanocarbon material at 600° C." is a weight in the following temperature programs 2) and 3).

Gas: air 100 mL/min
Temperature program:
1) Process of heating nanocarbon material to 100° C. from 30° C. at heating rate of 5° C./min
2) Process of keeping nanocarbon material at 100° C. for 120 minutes
3) Process of heating nanocarbon material to 1,000° C. from 100° C. at heating rate of 5° C./min <<Evaluation Standards>>

"A": The rate of weight loss at 600° C. was equal to or lower than 10%.

"B": The rate of weight loss at 600° C. was higher than 10% and equal to or lower than 20%.

"C": The rate of weight loss at 600° C. was higher than 20%.

The results are shown in Table 1.

[Evaluation of Thermoelectric Conversion Layer]

The thermoelectric conversion layers (CNT films) of Examples 1 to 22 and Comparative Examples 1 to 6 were measured and evaluated in terms of various items shown below. The thermoelectric conversion layer, which will be described later, in which graphene was used as a nanocarbon material was also evaluated in terms of various items by the same method.

(Change in Ionization Potential (Ip))

By using an atmospheric photoelectron spectrometer (AC-2, manufactured by RIKEN KEIKI Co., Ltd.), Ip of the CNT film was measured before and after the immersion in the dopant-containing solution, and an amount of change in Ip (eV) was calculated by the following formula. The results are shown in Table 1.

Amount of change in Ip(eV)=(Ip of CNT film after adsorption of onium salt(after immersion in dopant-containing solution)(eV))−(Ip of CNT film before adsorption of onium salt(before immersion in dopant-containing solution)(eV))

(Film Density)

The film density of the CNT film was calculated by the following formula. The film density was evaluated based on the following evaluation standards.

Film density(g/cm$^3$)=(weight of CNT film)/(volume of CNT film)

<<Evaluation Standards>>

"A": The film density was equal to or higher than 0.7 g/cm$^3$.

"B": The film density was equal to or higher than 0.45 g/cm$^3$ and less than 0.7 g/cm$^3$.

"C": The film density was less than 0.45 g/cm$^3$.

The results are shown in Table 1.

(Alignment Properties)

By the polarized Raman spectroscopy, the horizontal alignment properties and the in-plane alignment properties of CNT in the CNT film were evaluated. The higher the degree of alignment which will be described later, the better the alignment properties of CNT.

More specifically, a cross section, parallel to the electricity conduction direction, of the CNT film was irradiated with laser light of linear polarization of a wavelength of 532 nm, a degree of alignment was calculated by the following formula, and the horizontal alignment properties were evaluated based on the following evaluation standards.

Degree of alignment(degree of horizontal alignment)
=(G/D ratio at 90°)/(G/D ratio at 0°)

"G/D ratio at 90°" represents a ratio between G band intensity and D band intensity (G band intensity/D band intensity) derived from CNT that is obtained by irradiating a cross section of the CNT film with laser light of linear polarization in a direction parallel to a direction along which the electric conductivity of the CNT film is measured.

Furthermore, "G/D ratio at 0°" represents a ratio between G band intensity and D band intensity (G band intensity/D band intensity) derived from CNT that is obtained by irradiating a cross section of the CNT film with laser light of linear polarization in a direction orthogonal to the direction along which the electric conductivity of the CNT film is measured.

In addition, a main surface of the CNT film was irradiated with laser light of linear polarization of a wavelength of 532 nm, a degree of alignment was calculated by the following formula, and the in-plane alignment properties were evaluated based on the following evaluation standards.

Degree of alignment(degree of in-plane alignment)=
(G/D ratio at 90°)/(G/D ratio at 0°)

"G/D ratio at 90°" represents a ratio between G band intensity and D band intensity (G band intensity/D band intensity) derived from CNT that is obtained by irradiating a main surface of the CNT film with laser light of linear polarization in a direction parallel to a direction along which the electric conductivity of the CNT film is measured.

Furthermore, "G/D ratio at 0°" represents a ratio between G band intensity and D band intensity (G band intensity/D band intensity) derived from CNT that is obtained by irradiating a main surface of the CNT film with laser light of linear polarization in a direction orthogonal to the direction along which the electric conductivity of the CNT film is measured.

All the measurement surfaces (cross section and main surface) were being subjected to the polarized Raman spectroscopy after being smoothed by a cross section polisher treatment.

Figure 6A:
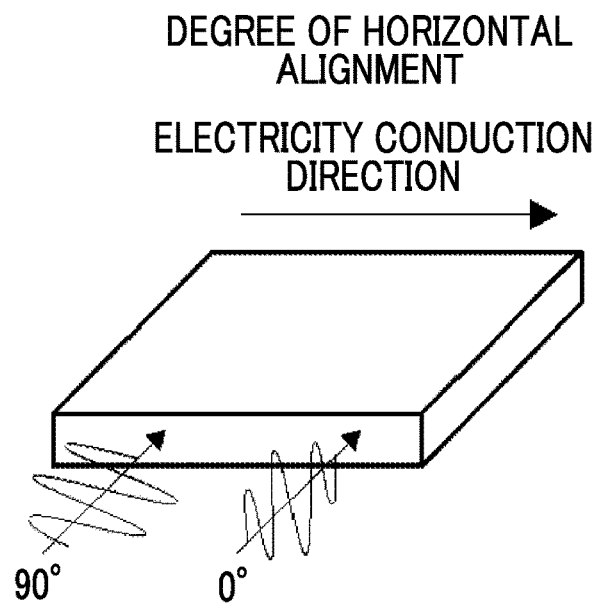
FIG. 6A is a schematic view for illustrating a method for measuring alignment properties (horizontal alignment properties) of CNT in a CNT film.
Figure 6B:
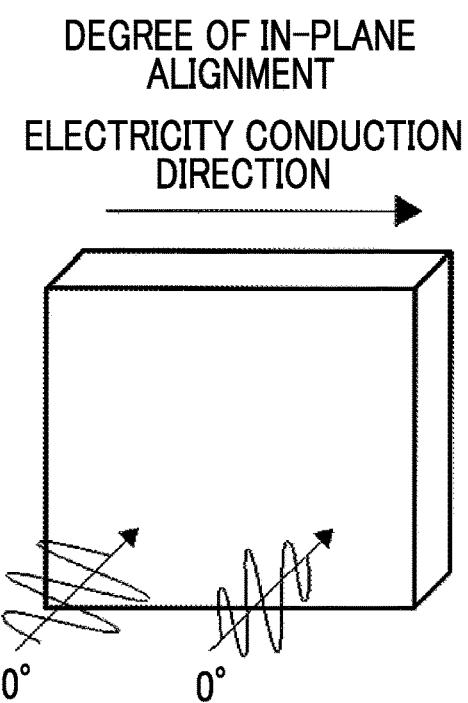
FIG. 6B is a schematic view for illustrating a method for measuring alignment properties (in-plane alignment properties) of CNT in a CNT film.

FIG. 6A and FIG. 6B are schematic views of the evaluation methods described above.

FIG. 6A shows the evaluation method of the degree of horizontal alignment, and FIG. 6B shows the evaluation method of the degree of in-plane alignment.

<<Evaluation standards>>
Horizontal Alignment
"A": The degree of alignment was equal to or higher than 2.4.
"B": The degree of alignment was less than 2.4.
In-Plane Alignment
"A": The degree of alignment was equal to or higher than 1.2.
"B": The degree of alignment was less than 1.2.
(Electric conductivity ($\sigma$) and Seebeck coefficient (S))
By using a thermoelectric characteristic measuring apparatus MODEL RZ2001i (manufactured by OZAWA SCIENCE CO., LTD.), an electric conductivity and a Seebeck coefficient (thermoelectromotive force per absolute temperature of 1 K) of the CNT film at about 80° C. and 105° C. were measured. By interpolation, an electric conductivity and a Seebeck coefficient at 100° C. were calculated.

Each of the electric conductivity and the Seebeck coefficient was evaluated based on values normalized by the following formula.
Electric Conductivity ($\sigma$)
By adopting Comparative Example 1 as a reference comparative example, a normalized electric conductivity of the CNT film of each of Examples 1 to 22 and Comparative Examples 1 to 6 was determined by the following formula. The evaluation standards are as below.

(Normalized electric conductivity)=(electric conductivity of thermoelectric conversion layer of each example or each comparative example)/(electric conductivity of thermoelectric conversion layer of reference comparative example)

<<Evaluation Standards>>
"A": The normalized electric conductivity was equal to or higher than 2.5.
"B": The normalized electric conductivity was equal to or higher than 2.0 and less than 2.5.
"C": The normalized electric conductivity was equal to or higher than 1.2 and less than 2.0.
"D": The normalized electric conductivity was equal to or higher than 0.8 and less than 1.2.
"E": The normalized electric conductivity was less than 0.8.
The results are shown in Table 1.
Seebeck Coefficient (S)
By adopting Comparative Example 1 as a reference comparative example, a normalized Seebeck coefficient of the CNT film of each of Examples 1 to 22 and Comparative Examples 1 to 6 was determined by the following formula. The evaluation standards are as below.

(Normalized Seebeck coefficient)=(Seebeck coefficient of thermoelectric conversion layer of each example or each comparative example)/(Seebeck coefficient of thermoelectric conversion layer of reference comparative example)

<<Evaluation Standards>>
"A": The normalized Seebeck coefficient was equal to or higher than 1.5.
"B": The normalized Seebeck coefficient was equal to or higher than 1.4 and less than 1.5.
"C": The normalized Seebeck coefficient was equal to or higher than 1.3 and less than 1.4.
"D": The normalized Seebeck coefficient was equal to or higher than 1.2 and less than 1.3.
"E": The normalized Seebeck coefficient was equal to or higher than 1.1 and less than 1.2.
"F": The normalized Seebeck coefficient was equal to or higher than 0.6 and less than 1.1.
"G": The normalized Seebeck coefficient was less than 0.6.
The results are shown in Table 1.
(Evaluation of Figure of Merit Z)
The figure of merit Z was calculated by the following formula.

(Figure of merit Z)=[(electric conductivity)×(Seebeck coefficient)$^2$]/thermal conductivity For calculating the figure of merit Z, the thermal conductivity of the CNT film of each of the examples and the comparative examples was calculated by the following formula.

(Thermal conductivity [W/mK])=(specific heat [J/kg·K])×(density [kg/m$^3$])×(thermal diffusivity [m$^2$/s])

"Specific heat" in the above formula was measured by differential scanning calorimetry (DSC method), and "density" was measured by mass/volume. "Thermal diffusivity" was measured using a thermal diffusivity measuring apparatus ai-Phase Mobile 1u (manufactured by ai-Phase Co., Ltd).

The figure of merit Z was evaluated based on values normalized by the following Formula.
Specifically, by adopting Comparative Example 1 as a reference comparative example, the normalized Z of each of Examples 1 to 22 and Comparative Examples 1 to 6 was determined by the following formula. The normalized figure of merit Z is simply referred to as "normalized Z" as well. The evaluation standards are as below.

(Normalized Z)=(figure of merit Z of thermoelectric conversion layer of each example or each comparative example)/(figure of merit Z of thermoelectric conversion layer of reference comparative example)

<<Evaluation Standards>>
"AA": The normalized Z was equal to or greater than 2.5.
"A": The normalized Z was equal to or greater than 2.3 and less than 2.5.
"B": The normalized Z was equal to or greater than 2.1 and less than 2.3.
"C": The normalized Z was equal to or greater than 1.9 and less than 2.1.
"D": The normalized Z was equal to or greater than 1.7 and less than 1.9.
"E": The normalized Z was equal to or greater than 1.5 and less than 1.7.
"F": The normalized Z was equal to or greater than 1.3 and less than 1.5.
"G": The normalized Z was equal to or greater than 1.1 and less than 1.3.
"H": The normalized Z was equal to or greater than 0.5 and less than 1.1.
"I": The normalized Z was less than 0.5.
(Evaluation of Performance Change by Water)
The CNT film of each of the examples and the comparative examples was put into an environmental chamber and kept as it was for 3 days at 40° C./60% RH. A retention rate of the figure of merit Z was calculated by the following formula and evaluated based on the following evaluation standards.

(Retention rate of figure of merit Z)=(figure of merit Z of thermoelectric conversion layer after being kept for 3 days at 40° C./60% RH)/(figure of merit Z measured immediately after thermoelectric conversion layer is prepared)

<<Evaluation Standards>>

"A": The retention rate of figure of merit Z was equal to or higher than 0.8.

"B": The retention rate of figure of merit Z was equal to or higher than 0.6 and less than 0.8.

"C": The retention rate of figure of merit Z was less than 0.6.

The results are shown in Table 1.

In Tables 1 to 4, "pKa" in the column of Onium salt means the pKa of a conjugate acid of an anion. For example, in Example 1, "pKa" means the pKa of a conjugate acid of a chlorine ion, which is −3.7.

As the value of pKa, the value (in water) listed in "Handbook of Chemistry, 5$^{th}$ revised edition, The Chemical Society of Japan" is described. Furthermore, in Tables 1 to 4, "Thermoelectric performance" means the thermoelectric conversion performance.

In Table 1, the thermoelectric conversion layer of Comparative Examples 2, 3, and 6 exhibits the polarity of the p-type, and accordingly, "thermoelectric conversion performance" and "performance change by water" were not evaluated.

In Tables 1 to 4, σ represents an electric conductivity (S/m), S represents a thermoelectromotive force (Seebeck coefficient, (V/K)) per absolute temperature of 1 K, and Z represents a figure of merit (1/K).

As is evident from the results in Table 1, all of the CNT films of examples exhibited the n-type characteristics. Furthermore, it was confirmed that compared to Comparative Examples 1, 4, and 5 in which an onium salt other than the onium salt represented by Formula (1) was used as a dopant, the CNT films of examples exhibited excellent thermoelectric conversion performance (Seebeck coefficient S and figure of merit Z).

In addition, it was confirmed that because the onium salt represented by Formula (1) that had an anion exhibiting weak nucleophilicity was used in the CNT films of examples, the figure of merit Z of the CNT films hardly changed even under the environmental influence resulting from moisture.

Through the comparison between Example 1 and Example 2, it was confirmed that by the addition of a binder (Example 2), the thermal conductivity was reduced, and the figure of merit Z was improved.

Through the comparison among Example 1, Example 3, and Example 4, it was confirmed that by reducing the rate of weight loss (%) of CNT at 600° C. (in other words, by increasing purity) (Example 3 and Example 4), the Seebeck coefficient S was further improved. Furthermore, it was confirmed that the electric conductivity σ and the figure of merit Z were also improved.

TABLE 1

| | | Onium salt | | | | | Degree of alignment | | Thermoelectric performance | | | | Performance |
| | Nanocarbon material | Structure | pKa of conjugate acid of counteranion ($X^-$) | Ip change/ eV | Rate of weight loss at 600° C./% | Film density/ gem$^{-3}$ | In-plane | Horizontal | Polarity | σ | S | Z | change by water |
|---|---|---|---|---|---|---|---|---|---|---|---|---|---|
| Example 1 | CNT | NMe($C_8H_{17}$)$_3$Cl | −3.7 | −0.01 | C | C | B | B | n | E | C | E | A |
| Example 2 | CNT | NMe($C_8H_{17}$)$_3$Cl | −3.7 | −0.01 | C | C | B | B | n | E | C | D | A |
| Example 3 | CNT | NMe($C_8H_{17}$)$_3$Cl | −3.7 | −0.01 | B | C | B | B | n | E | B | D | A |
| Example 4 | CNT | NMe($C_8H_{17}$)$_3$Cl | −3.7 | −0.01 | A | C | B | B | n | D | A | C | A |
| Example 5 | CNT | NMe($C_8H_{17}$)$_3$Cl | −3.7 | −0.01 | A | B | B | B | n | C | A | B | A |
| Example 6 | CNT | NMe($C_8H_{17}$)$_3$Cl | −3.7 | −0.01 | A | A | B | B | n | B | A | A | A |
| Example 7 | CNT | NMe($C_8H_{17}$)$_3$Cl | −3.7 | −0.01 | A | C | A | A | n | C | A | B | A |
| Example 8 | CNT | NMe($C_8H_{17}$)$_3$Cl | −3.7 | −0.01 | A | A | A | A | n | A | A | AA | A |
| Example 9 | CNT | N($C_8H_{17}$)$_4$Cl | −3.7 | −0.02 | C | C | B | B | n | E | C | E | A |
| Example 10 | CNT | N($C_8H_{17}$)$_4$Cl | −3.7 | −0.02 | A | A | A | A | n | A | A | AA | A |
| Example 11 | CNT | N($C_8H_{17}$)$_4$Br | −4.1 | −0.02 | C | C | B | B | n | E | C | E | A |
| Example 12 | CNT | N($C_8H_{17}$)$_4$Br | −4.1 | −0.02 | A | A | A | A | n | A | A | AA | A |
| Example 13 | CNT | N($C_8H_{17}$)$_4$I | −10 | −0.01 | C | C | B | B | n | E | D | F | A |
| Example 14 | CNT | N($C_8H_{17}$)$_4$I | −10 | −0.01 | A | A | A | A | n | A | B | A | A |
| Example 15 | CNT | N($C_2H_5$)$_4$F | 2.7 | −0.04 | C | C | B | B | n | D | E | G | B |
| Example 16 | CNT | N($C_2H_5$)$_4$F | 2.7 | −0.04 | A | A | A | A | n | A | C | B | B |
| Example 17 | CNT | NMe$_4$F | 2.7 | −0.01 | C | C | B | B | n | D | E | G | B |
| Example 18 | CNT | NMe$_4$F | 2.7 | −0.01 | A | A | A | A | n | A | C | B | B |
| Example 19 | CNT | N($C_8H_{17}$)$_4$NO$_3$ | −1.8 | −0.03 | C | C | B | B | n | D | E | G | B |
| Example 20 | CNT | N($C_8H_{17}$)$_4$NO$_3$ | −1.8 | −0.03 | A | A | A | A | n | A | C | B | B |
| Example 21 | CNT | N($C_6H_{13}$)$_4$H$_2$PO$_4$ | 1.8 | −0.03 | C | C | B | B | n | D | E | G | B |
| Example 22 | CNT | N($C_6H_{13}$)$_4$H$_2$PO$_4$ | 1.8 | −0.03 | A | A | A | A | n | A | C | B | B |
| Comparative Example 1 | CNT | N($C_4H_9$)$_4$OH | 15 | −0.08 | C | C | B | B | n | D | F | H | C |
| Comparative Example 2 | CNT | NMe$_4$Cl | −3.7 | 0.02 | C | C | B | B | p | | | | |
| Comparative Example 3 | CNT | N($C_5H_{11}$)$_4$Cl | −3.7 | 0.01 | C | C | B | B | p | | | | |
| Comparative Example 4 | CNT | N($C_6H_{13}$)$_4$Cl | −3.7 | 0 | C | C | B | B | n | E | G | I | A |
| Comparative Example 5 | CNT | NMe$_3$($C_{14}H_{29}$)Cl | −3.7 | 0 | C | C | B | B | n | E | G | I | A |
| Comparative Example 6 | CNT | N($C_2H_5$)$_4$I | −10 | 0.01 | C | C | B | B | p | | | | |

Through the comparison among Example 4, Example 5, and Example 6, it was confirmed that by increasing the film density (Example 5 and Example 6), the electric conductivity σ was further improved. Furthermore, it was confirmed that the figure of merit Z was also further improved.

Through the comparison between Example 4 and Example 7, it was confirmed that by increasing the degree of alignment (Example 7), the electric conductivity σ was further improved. Furthermore, it was confirmed that the figure of merit Z was also further improved.

Through the comparison between Example 1 and Example 8, it was confirmed that by reducing the rate of weight loss (%) at 600° C. and increasing the film density and the degree of alignment, the electric conductivity σ and the Seebeck coefficient S were markedly improved. Furthermore, it was confirmed that the figure of merit Z was also markedly improved.

Through the comparison among Examples 1, 9, 11, 13, 15, 17, 19, and 21 (or Examples 1, 10, 12, 14, 16, 18, and 20), it was confirmed that with the onium salt (Examples 13 and 14), in which the pKa of a conjugate acid of the anion was low (the onium salt exhibited weak nucleophilicity), the extent of doping to the change to an n-type was slightly reduced, and specifically, the Seebeck coefficient S and the figure of merit Z were reduced. In contrast, with the onium salt (Examples 15 to 22), in which the pKa of a conjugate acid of the anion was high (the onium salt exhibited strong nucleophilicity), the doping for change to an n-type slightly excessively proceeded. As a result, the performance slightly deteriorated, and specifically, the Seebeck coefficient S and the figure of merit Z were reduced. Furthermore, it was confirmed that in a case where the anion is Cl⁻, Br⁻, or I⁻, the figure of merit Z hardly changes even under the environmental influence resulting from moisture.

Through the comparison among Examples 9 to 22, it was confirmed that in a case where the anion is Cl⁻, Br⁻, or I⁻ and preferably Cl⁻ or Br⁻, the level of the electric conductivity σ, the Seebeck coefficient S, and the figure of merit Z are further improved. In addition, it was confirmed that the figure of merit Z hardly changes even under the environmental influence resulting from moisture.

The figure of merit Z of the CNT films of Comparative Examples 1, 4, and 5 was poor.

It is considered that in Comparative Example 1, because a hydroxide ion was used as an anion, the nucleophilicity was strong, and hence doping excessively proceeded. As a result, although the electric conductivity σ was excellent, the Seebeck coefficient S was reduced and the thermal conductivity κ was increased, and hence the figure of merit Z did not satisfy the predetermined requirement. Furthermore, it was confirmed that the figure of merit Z easily changes by the environmental influence resulting from moisture.

In Comparative Examples 2, 3, and 6, the number of carbon atoms in the alkyl group of the cation was small, that is, the cation easily contacted CNT. Therefore, doping for change to an n-type could not proceed.

In Comparative Examples 4 and 5, although the doping for change to an n-type could proceed, the number of carbon atoms in the alkyl group of the cation was insufficient. Therefore, doping for change to an n-type caused by the anion proceeded insufficiently (the Fermi level was inappropriate), and a figure of merit Z did not satisfy the predetermined requirement.

Example 23

Both surfaces of the n-type CNT film of Example 1 were irradiated with ultraviolet rays (amount of light: 200 mJ/cm$^2$) by using an ultraviolet irradiation machine (manufactured by EYE GRAPHICS Co., Ltd., ECS-401GX). Then, the CNT film was evaluated in terms of various items in the same manner as in Example 1. The results are shown in Table 2.

Comparative Example 7

An n-type CNT film was obtained by the same preparation process as that in Example 1, except that the methyl trioctylammonium chloride was changed to triphenylsulfoinum tetrakis(pentafluorophenyl)borate (Ph$_3$SB(C$_6$F$_5$)$_4$, manufactured by TOKYO CHEMICAL INDUSTRY CO., LTD.). Both surfaces of the obtained film were irradiated with ultraviolet rays (amount of light: 200 mJ/cm$^2$) by using an ultraviolet irradiation machine (manufactured by EYE GRAPHICS Co., Ltd., ECS-401GX). Then, the CNT film was evaluated in terms of various items in the same manner as in Example 1. The results are shown in Table 2.

All of the electric conductivity σ, the Seebeck coefficient S, and the figure of merit Z in Table 2 were evaluated by using Comparative Example 1 as a reference comparative example.

TABLE 2

| | | Onium salt | | | | | Degree of alignment | | Thermoelectric performance | | | Performance change by water |
| | | | pKa of conjugate acid of counteranion (X⁻) | Ip eV | Rate of weight loss at 600° C./% | Film density/ gcm⁻³ | In-plane | Horizontal | Polarity | σ | S | Z | |
| | Nanocarbon material | Structure | | | | | | | | | | | |
|---|---|---|---|---|---|---|---|---|---|---|---|---|---|
| Example 23 | CNT | NMe(C$_8$H$_{17}$)$_3$Cl | -3.7 | -0.01 | C | C | B | B | n | E | C | E | A |
| Comparative Example 7 | CNT | Ph$_3$S B(C$_6$F$_5$)$_4$ | — | 0.16 | C | C | B | B | p | B | G | H | C |

In the CNT film of Comparative Example 7, the onium salt is cleaved due to the light irradiation and generates an acid. As a result, CNT is doped and becomes a p-type, and accordingly, the electric conductivity σ increases, and the Seebeck coefficient S is reduced. In contrast, in the n-type CNT film of Example 23, CNT remains as an n-type even after the light irradiation. That is, the generation of an acid by light does not occur, and the anionic portion donates electrons to CNT.

(Example 24) Use of Graphene as Nanocarbon Material

By using a mechanical homogenizer (manufactured by SMT Corporation, HIGH-FLEX HOMOGENiZER HF93), 40 mg of graphene (trade name: "GRAPHENE NANO-PLATELET", manufactured by TOKYO CHEMICAL INDUSTRY CO., LTD.) and 32 mL of acetone were mixed together for 5 minutes at 18,000 rpm, thereby obtaining a dispersion liquid. The dispersion liquid was filtered under reduced pressure by using a glass filter equipped with a membrane filter made of polytetrafluoroethylene (PTFE) and a suction bottle, thereby obtaining a graphene film. The obtained graphene film was dried for 30 minutes at 50° C. and then for 30 minutes at 120° C., and then was cut in a size of about 1 cm×1 cm.

The obtained 1 cm×1 cm graphene film was immersed in 5.3 mL of a methanol solution containing 9.4 mM tetraoctylammonium chloride (manufactured by TOKYO CHEMICAL INDUSTRY CO., LTD.). The graphene film was immersed in the methanol solution for 2 hours at 25° C., then pulled up, and rinsed with methanol. The rinsed graphene film was dried for 2 hours at 30° C. in a vacuum, thereby obtaining an n-type graphene film.

Comparative Example 8

An n-type graphene film was obtained in the same manner as in Example 24, except that the tetraoctylammonium chloride was changed to tetrahexylammonium hydroxide ($N(C_6H_{13})_4OH$, manufactured by TOKYO CHEMICAL INDUSTRY CO., LTD.).

The n-type graphene films prepared in Example 24 and Comparative Example 8 were evaluated in terms of various items in the same manner as in Example 1.

The evaluation was performed in the same manner as in Example 1, except that the electric conductivity σ, the Seebeck coefficient S, and the figure of merit Z were evaluated by using Comparative Example 8 as a reference comparative example. The results are shown in Table 3.

Example 25

An n-type CNT film was obtained by the same preparation process as that in Example 1, except that the methyl trioctylammonium chloride was changed to tetraoctylammonium chloride.

Example 26

An n-type CNT film was obtained by the same preparation process as that in Example 1, except that the methyl trioctylammonium chloride was changed to tetraoctylammonium chloride, and the single-layer CNT was changed to double-layered CNT (manufactured by Sigma-Aldrich Co. LLC.).

Example 27

An n-type CNT film was obtained by the same preparation process as that in Example 1, except that the methyl trioctylammonium chloride was changed to tetraoctylammonium chloride, and the single-layer CNT was changed to multi-layered CNT (manufactured by Sigma-Aldrich Co. LLC.).

Example 28

An n-type graphene film was obtained in the same manner as in Example 24.

The n-type thermoelectric conversion layers prepared in Examples 25 to 28 were evaluated in terms of various items in the same manner as that in Example 1.

As a result, it was confirmed that the improvement of the Seebeck coefficient S and the figure of merit Z could be graded, from the greatest to the smallest, in order of the graphene, the multilayered CNT, the double-layered CNT, and the single-layer CNT.

(Example 29) Composition for Forming Thermoelectric Conversion Layer

Carbon nanotubes (40 mg, manufactured by OCSiAl) were added to 32 mL of a methanol solution containing 9.3 mM methyl trioctylammonium chloride. The mixture was left to stand for 2 hours at room temperature and then mixed using a mechanical homogenizer (manufactured by SMT Corporation, HIGH-FLEX HOMOGENiZER HF93) for 5 minutes at 18,000 rpm, thereby obtaining a dispersion liquid. The dispersion liquid was filtered under reduced pressure by using a glass filter equipped with a membrane filter made of PTFE and a suction bottle, thereby obtaining a CNT film. The obtained CNT film was dried for 2 hours at 30° C. in a vacuum and cut in a size of about 1 cm×1 cm, thereby obtaining an n-type CNT film.

Then, the n-type CNT film prepared in Example 29 was evaluated in terms of various items.

The evaluation was performed in the same manner as in Example 1. The results are shown in Table 4.

TABLE 3

| | | Onium salt | | | | Thermoelectric performance | | | Performance change by |
|---|---|---|---|---|---|---|---|---|---|
| | Nanocarbon material | Structure | pKa of conjugate acid of counteranion ($X^-$) | Ip change/ eV | Film density/ $gem^{-3}$ | Polarity | σ | S | Z | water |
| Example 24 | Graphene | $N(C_8H_{17})_4Cl$ | −3.7 | −0.02 | C | n | E | E | G | A |
| Comparative Example 8 | Graphene | $N(C_6H_{13})_4OH$ | 15 | −0.08 | C | n | D | F | H | C |

TABLE 4

| | | Onium salt | | | | Degree of alignment | | Thermoelectric performance | | | | Performance |
| | Nanocarbon | | pKa of conjugate acid of counteranion | Ip | Rate of weight | Film | | | | | | change by |
| | material | Structure | (X⁻) | change/ eV | loss at 600° C./% | density/ gem⁻³ | In-plane | Hori-zontal | Polarity | σ | S | Z | water |
|---|---|---|---|---|---|---|---|---|---|---|---|---|---|
| Example 29 | CNT | NMe(C₈H₁₇)₃Cl | −3.7 | −0.01 | C | C | B | B | n | E | C | E | A |

(Example 30) Preparation of Thermoelectric Conversion Module

Sixteen n-type thermoelectric conversion layers were prepared in the same manner as in Example 1, except that the cloth-like CNT film was cut in a size of 4 mm×8 mm.

Figure 7:
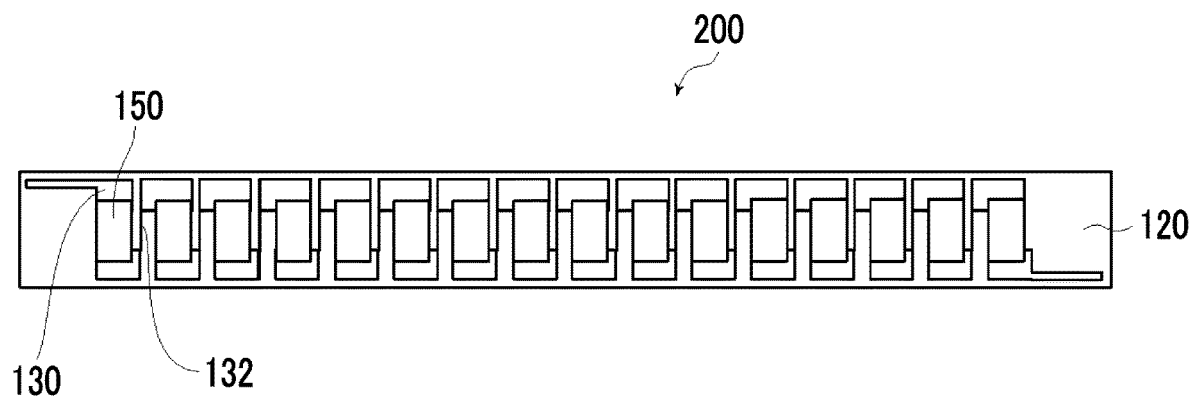
FIG. 7 is a schematic view of a thermoelectric conversion module prepared in Examples.

Then, by using the thermoelectric conversion layers, the thermoelectric conversion module shown in FIG. 7 was prepared.

First, a silver paste was printed on a 1.6 cm (width)×14 cm (length) substrate 120 (polyimide substrate) by screen printing, the printed material of the silver paste was dried for 1 hour at 120° C., and 16 pairs of electrodes 130 and wiring 132 were simultaneously formed. The size of one electrode was 4 mm (width)×2.5 mm (length), and an interelectrode distance was 5 mm. Furthermore, in order that sixteen thermoelectric conversion layers 150, which will be described later, were connected to each other in series, a pair of electrodes 130 were connected to each other through wiring having a width of 1 mm.

Then, the n-type CNT film cut in a size of 4 mm (width)×8 mm (length) was interposed between and bonded to the electrodes by using a double-sided tape. The portions in which the electrodes and the CNT film contacted each other were coated with a silver paste, and the silver paste was dried for 1 hour at 120° C. such that the electrodes and the CNT film were bonded and electrically connected to each other. A thermoelectric conversion module 200 obtained in this way was used as a thermoelectric conversion module of Example 30.

Comparative Example 9

A thermoelectric conversion module was prepared in the same manner as in Example 30, except that the n-type thermoelectric conversion layer of Comparative Example 1 that was cut in a size of 4 mm×8 mm was used as a thermoelectric conversion layer.

(Evaluation of Thermoelectric Conversion Module)

Figure 8:
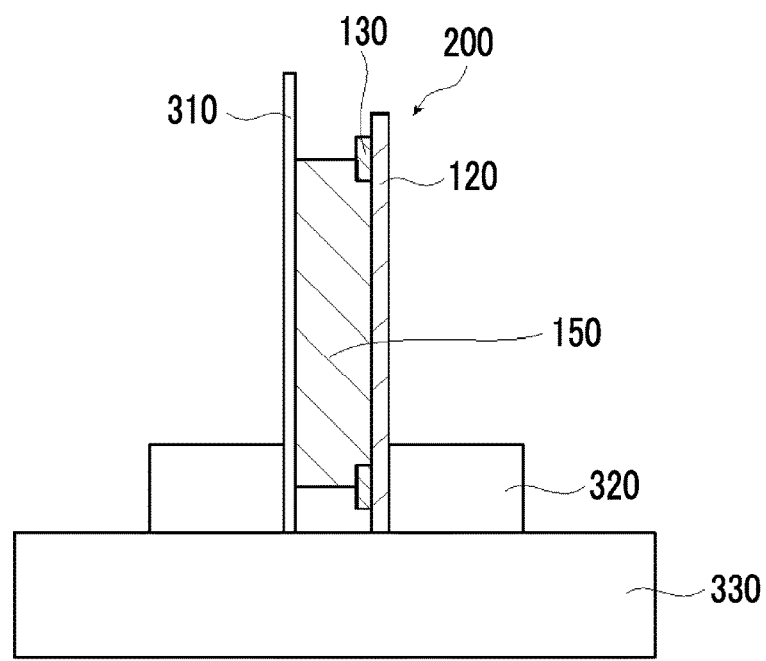
FIG. 8 is a schematic view showing a device for measuring output of the thermoelectric conversion module.

FIG. 8 is a view for illustrating a method for evaluating the thermoelectric conversion modules in examples. As shown in FIG. 8, a power generating layer side of the thermoelectric conversion module 200 was protected with an aramid film 310. Furthermore, the lower portion of the thermoelectric conversion module 200 was fixed by being interposed between copper plates 320 installed on a hot plate 330 such that the lower portion of the thermoelectric conversion module 200 could be efficiently heated.

Then, terminals (not shown in the drawing) of a source meter (manufactured by Keithley Instruments, Inc.) were mounted on extraction electrodes (not shown in the drawing) at both ends of the thermoelectric conversion module 200, and the temperature of the hot plate 330 was caused to remain constant at 100° C. such that a temperature difference was caused in the thermoelectric conversion module 200.

The current-voltage characteristics were measured, and a short-circuit current and an open voltage were measured. From the measured results, an output was calculated by "(Output)=[(Current)×(Voltage)/4]". As a result, the output was higher in Example 30 than in Comparative Example 9, which supports the performance of the thermoelectric conversion layer of Example 30.

EXPLANATION OF REFERENCES

110, 120, 130, 140: thermoelectric conversion element
11, 17: metal plate
12, 22: first substrate
13, 23: first electrode
14, 24: n-type thermoelectric conversion layer
15, 25: second electrode
16, 26: second substrate
30: second substrate
32: first substrate
32*a*, 30*a*: low thermal conduction portion
32*b*, 30*b*: high thermal conduction portion
34: n-type thermoelectric conversion layer
36: first electrode
38: second electrode
41: p-type thermoelectric conversion layer
42: n-type thermoelectric conversion layer
43: lower substrate
44: second electrode
45: first and third electrodes
45A: first electrode
45B: third electrode
46: upper substrate
47: hole
48: electron
120: substrate
130: electrode
132: wiring
150: thermoelectric conversion layer
200: thermoelectric conversion module
310: aramid film
320: copper plate
330: hot plate

What is claimed is:

1. An n-type semiconductor layer comprising:
a nanocarbon material; and
an onium salt represented by Formula (1),

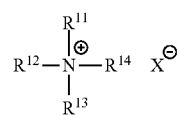

(1)

in Formula (1),

R$^{11}$, R$^{12}$, R$^{13}$, and R$^{14}$ each independently represent a monovalent organic group selected from the group consisting of an aliphatic hydrocarbon group, an aralkyl group, an aryl group, and a heterocyclic group, and the aliphatic hydrocarbon group may be any of a linear, branched, or cyclic aliphatic hydrocarbon group and may contain a heteroatom, X$^-$ represents F$^-$, Cl$^-$, Br$^-$, I$^-$, P(=O)(OH)$_2$O$^-$, or NO$_3^-$, in a case where X$^-$ represents Cl$^-$, Br$^-$, I$^-$, or NO3$^-$, at least any two or more groups among R$^{11}$ to R$^{14}$ each independently represent a monovalent organic group having 8 or more carbon atoms, in a case where X$^-$ represents P(=O)(OH)$_2$O$^-$, at least any two or more groups among R$^{11}$ to R$^{14}$ each independently represent a monovalent organic group having 6 or more carbon atoms, and in a case where X$^-$ represents F$^-$, at least any two or more groups among R$^{11}$ to R$^{14}$ each independently represent a monovalent organic group having 1 or more carbon atoms.

2. The n-type semiconductor layer according to claim 1, wherein X$^-$ represents Cl$^-$, Br$^-$, or I$^-$.

3. The n-type semiconductor layer according to claim 2, wherein X$^-$ represents Cl$^-$ or Br$^-$.

4. The n-type semiconductor layer according to claim 2, wherein a rate of weight loss of the nanocarbon material in the atmosphere at 600° C. is equal to or lower than 20%.

5. The n-type semiconductor layer according to claim 2, wherein the nanocarbon material is carbon nanotubes.

6. The n-type semiconductor layer according to claim 1, wherein X$^-$ represents Cl$^-$ or Br$^-$.

7. The n-type semiconductor layer according to claim 6, wherein a rate of weight loss of the nanocarbon material in the atmosphere at 600° C. is equal to or lower than 20%.

8. The n-type semiconductor layer according to claim 1, wherein a rate of weight loss of the nanocarbon material in the atmosphere at 600° C. is equal to or lower than 20%.

9. The n-type semiconductor layer according to claim 1, wherein the nanocarbon material is carbon nanotubes.

10. The n-type semiconductor layer according to claim 9, wherein the carbon nanotubes contain single-layer carbon nanotubes as a main component.

11. The n-type semiconductor layer according to claim 1 that has a film density equal to or higher than 0.45 gcm$^{-3}$.

12. A thermoelectric conversion layer comprising; the n-type semiconductor layer according to claim 1.

13. A thermoelectric conversion element comprising: the thermoelectric conversion layer according to claim 12.

14. A thermoelectric conversion module comprising: a plurality of the thermoelectric conversion elements according to claim 13.

15. A composition for forming an n-type semiconductor layer, comprising:
a nanocarbon material; and
an onium salt represented by Formula (1),

in Formula (1),

R$^{11}$, R$^{12}$, R$^{13}$, and R$^{14}$ each independently represent a monovalent organic group selected from the group consisting of an aliphatic hydrocarbon group, an aralkyl group, an aryl group, and a heterocyclic group, and the aliphatic hydrocarbon group may be any of a linear, branched, or cyclic aliphatic hydrocarbon group and may contain a heteroatom, and X$^-$ represents F$^-$, Cl$^-$, Br$^-$, I$^-$, P(=O)(OH)$_2$O$^-$, or NO$_3^-$, in a case where X$^-$ represents Cl$^-$, Br$^-$, I$^-$, or NO3$^-$, at least any two or more groups among R$^{11}$ to R$^{14}$ each independently represent a monovalent organic group having 8 or more carbon atoms, in a case where X$^-$ represents P(=O)(OH)$_2$O$^-$, at least any two or more groups among R$^{11}$ to R$^{14}$ each independently represent a monovalent organic group having 6 or more carbon atoms, and in a case where X$^-$ represents F$^-$, at least any two or more groups among R$^{11}$ to R$^{14}$ each independently represent a monovalent organic group having 1 or more carbon atoms.

16. The composition for forming an n-type semiconductor layer according to claim 15, wherein X$^-$ represents F$^-$, Cl$^-$, Br$^-$, or I$^-$.

17. The composition for forming an n-type semiconductor layer according to claim 15, wherein X$^-$ represents Cl$^-$ or Br$^-$.

18. The composition for forming an n-type semiconductor layer according to claim 15, wherein a rate of weight loss of the nanocarbon material in the atmosphere at 600° C. is equal to or lower than 20%.

19. The composition for forming an n-type semiconductor layer according to claim 15, wherein the nanocarbon material is carbon nanotubes.

20. The composition for forming an n-type semiconductor layer according to claim 19, wherein the carbon nanotubes contain single-layer carbon nanotubes as a main component.

* * * * *